United States Patent [19]
Lee et al.

[11] Patent Number: 5,748,538
[45] Date of Patent: May 5, 1998

[54] OR-PLANE MEMORY CELL ARRAY FOR FLASH MEMORY WITH BIT-BASED WRITE CAPABILITY, AND METHODS FOR PROGRAMMING AND ERASING THE MEMORY CELL ARRAY

[75] Inventors: Peter W. Lee, Saratoga, Calif.; Hsing-Ya Tsao; Fu-Chang Hsu, both of Hsin-Chu, Taiwan

[73] Assignee: Aplus Integrated Circuits, Inc., Saratoga, Calif.

[21] Appl. No.: 746,665

[22] Filed: Nov. 14, 1996

Related U.S. Application Data

[63] Continuation-in-part of Ser. No. 664,639, Jun. 17, 1996, and Ser. No. 676,066, Jul. 5, 1996.

[51] Int. Cl.$^6$ ........................................ G11L 16/00
[52] U.S. Cl. ........................ 365/185.06; 365/185.13
[58] Field of Search .................... 365/185.06, 185.13, 365/185.11, 230.03, 185.33

[56] References Cited

U.S. PATENT DOCUMENTS

| | | | |
|---|---|---|---|
| 4,698,787 | 10/1987 | Mukherjee et al. | 365/185 |
| 4,949,309 | 8/1990 | Rao | 365/218 |
| 5,097,444 | 3/1992 | Fong | 365/185 |
| 5,109,361 | 4/1992 | Yim et al. | 365/218 |
| 5,126,808 | 6/1992 | Montalvo et al. | 357/23.5 |
| 5,185,718 | 2/1993 | Rinerson et al. | 365/185 |
| 5,191,556 | 3/1993 | Radjy | 365/235 |
| 5,396,459 | 3/1995 | Arakawa | 365/185 |
| 5,438,544 | 8/1995 | Makino | 365/185 |
| 5,467,307 | 11/1995 | D'Arrigo et al. | 365/185.06 |
| 5,467,309 | 11/1995 | Tanaka et al. | 365/185.14 |
| 5,615,153 | 3/1997 | Yiv et al. | 365/185.13 |

OTHER PUBLICATIONS

Endoh et al., "A New Write/Erase Method for the Reduction of the Stress–Induced Leakage Current Based on the Deactivation of Step Tunneling Sites", *IEDM*, 94:49–52 (1994).

Nazoe et al., International Solid State Circuits Conference, Paper TA 7.3: "A 3.3V High–Density AND Flash Memory with 1 ms/512B Erase & Program Time" (1995).

Ohnakado et al., "Novel Electron Injection Method Using Band–to–Band Tunneling–Induced Hot Electron (BBHE) for Flash Memory with a P–Channel Cell", *IEDM*, 95:279–282 (1995).

Oyama et al., "A Novel Erasing Technology for 3.3V Flash Memory with 64 Mb Capacity and Beyond", *IEDM*, 92:607–610 (1992).

Primary Examiner—Tan T. Nguyen
Attorney, Agent, or Firm—Flehr Hohbach Test Albritton & Herbert LLP

[57] ABSTRACT

A memory cell array of a flash electrically erasable programmable read only memory (EEPROM) includes a plurality of transistor cells arranged in rows and columns. The sources of transistor cells in the same memory block are connected to a main source line through a control gate, as are the drains. The separate source and drains in the column direction are designed for a bit-based write capability. Writing, such as erasing or programming, of a selected transistor cell uses the Fowler-Nordheim tunneling method and can be accomplished due to the programming or erase inhibit voltage that is applied to non-selected transistor cells. The associated circuitry for bit-based writing, as well as methods of programming and erasing the memory cell array, with over-program and over-erase repair capability, are also disclosed.

10 Claims, 23 Drawing Sheets

OR-PLANE MEMORY CELL ARRAY FOR FLASH MEMORY WITH BIT-BASED WRITE CAPABILITY, AND METHODS FOR PROGRAMMING AND ERASING THE MEMORY CELL ARRAY

CROSS-REFERENCE TO RELATED APPLICATIONS

This is a continuation-in-part (CIP) application of co-pending U.S. patent application Ser. No. 08/664,639, entitled "Flash Memory Read/Write Controller," filed on Jun. 17, 1996, and U.S. patent application Ser. No. 08/676,066, entitled "Flash Memory Word Line Decoder With Over Erase Repair," filed on Jul. 5, 1996. The parent cases are incorporated herein by reference.

BACKGROUND OF THE INVENTION

1. Field of the Invention

The invention relates to a flash memory, more particularly to a new memory cell array for a flash electrically erasable programmable read only memory (EEPROM) with bit-based write capability and to methods for programming and erasing the memory cell array.

2. Description of the Related Art

Flash EEPROMs have gained enormous popularity in recent years in view of their ability to reduce the erase segment to a single word line. A smaller erase segment results in the advantage of improved reliability since the smaller erase segment has better endurance as compared to a larger erase segment during a block erase operation. In addition, the rewrite operation can be simplified to a smaller number of sectors, and system performance degradation can be minimized. However, some applications still need the erase segment to be reduced to a byte-erase level. That is, these applications require the use of conventional parallel EEPROMs in view of the inability of commonly used flash EEPROMs to provide such a function.

The conventional NOR-plane and NAND-plane flash EEPROM use the larger erase segment, such as block erase, during erasing. On the other hand, other flash EEPROM architectures, such as the EE-NOR, DINOR, split-gate NOR, Dual-String NOR and the AND-plane, use a smaller erase segment, e.g. one row or page. Except for the AND-plane flash EEPROM, assuming that the erase operation is achieved by raising the threshold voltage of the selected memory cell, sub-page erasure cannot be performed for the other flash EEPROM architectures since the erase inhibit or enable voltage on the bit lines will be in conflict when a high voltage is applied to the control gate. The shared source line design in the row direction will apply the erase enable voltage (e.g. 0 volt) to the whole bit line. FIG. 1 illustrates a conventional AND-plane memory cell array for a flash EEPROM. As shown, bit-erasable and bit-programming of the memory cell array can be performed by shutting off the source control gates 11, 12, 13, 14 that are connected to the main source line. Thus, the main bit lines 15, 16, 17, 18 can individually apply the different voltages to each sub-bit line through the drain control gates 19, 20, 21, 22. For example, whenever a high voltage (e.g. 12 to 15 volts) is applied to the word line 23, a medium voltage (e.g. 5 to 8 volts), which serves as the erase inhibit voltage, can be applied to the main bit line 15. Meanwhile, the erase enable voltage, which is at ground level, is applied to the other main bit lines 16, 17, 18. To reduce the drain disturb, the medium voltage is applied to the non-selected word line 24. As a result, the memory cells 26, 27, 28 are erased, while the other memory cells 25, 29, 30, 31, 32 are kept in their original states. A read/write controller which permits bit erasure of the AND-plane memory cell array has been disclosed in co-pending U.S. patent application Ser. No. 08/611,600, entitled "Flash Memory Read/Write Controller," and filed on Jun. 17, 1996, the disclosure of which is incorporated herein by reference.

The aforementioned conventional AND-plane memory cell array has a drawback residing in noise caused by the configuration of the parallel metal bit lines. The decreased metal bit line pitch, which is necessary to scale down the die size for cost concerns, will result in significant coupling noise among adjacent metal bit lines. In addition, noise during the discharge phase leads to erroneous readings of "1" data as "0" data. To reduce the noise, the read operation is divided into two phases. The first phase is for reading even address data, while the second phase is for reading odd address data. The inactive metal bit lines work as shielding lines in each phase of the read operation. While this technique is effective in serial page reading, significant noise is still present during random byte reading.

U.S. Pat. No. 5,126,808 discloses a conventional NOR-plane memory cell array which is subdivided into bytes, and which has every group of adjacent eight bit lines formed as bit 0 to bit 7 (B00 to B07), as shown in FIG. 2. While byte-erase may be applied to any byte, such an operation results in a very severe problem in that the high erase voltage will be transferred onto the bit line if the threshold voltage of the adjacent memory cell is at the "ON" state. Undesired drain erase will thus occur for the non-selected memory cells. Moreover, since the drain side of the non-selected memory cells is not a double diffusion, the high reverse bias voltage may result in junction breakdown. Therefore, the NOR-plane memory cell array of FIG. 2, which employs a high-voltage source byte-erase, does not provide reasonable means for selectively erasing a row of the memory cell array.

SUMMARY OF THE INVENTION

The main object of the present invention is to provide a flash electrically erasable programmable read only memory (EEPROM) and a bit-erasable, bit-programmable OR-plane flash memory cell array which use Fowler-Nordheim (F-N) tunneling for erasure and programming and which combine the features of byte erasure under a higher density area.

Another object of the present invention is to provide a memory cell array in which non-selected transistor cells can be inhibited during erasing and programming operations to reduce significantly stressing of the transistor cells, thereby resulting in enhanced endurance.

Still another object of the present invention is to provide a memory cell array which provides adequate protection against noise during reading, thereby improving the access time during the read operation.

Still another object of the present invention is to provide a memory cell array with a layout arrangement that results in a loosened pitch for metal lines and contacts, thereby resulting in higher reliability during manufacturing.

Yet another object of the present invention is to provide a method of programming a flash memory cell array with over-program repair capability.

A further object of the present invention is to provide a method of erasing a flash memory cell array with over-erase repair capability.

According to one aspect of the present invention, a memory cell array comprises a matrix of basic circuits that include: first and second word lines; first and second source control lines; first and second drain control lines; first, second and third main source lines; first and second main bit lines; two rows and four columns of transistor cells, the transistor cells in each of the rows having gate terminals which are coupled to a respective one of the first and second word lines, the transistor cells in each of the columns having source terminals coupled to a respective one of first, second, third and fourth sub-source lines, and drain terminals coupled to a respective one of first, second, third and fourth sub-bit lines; a first source control gate pair including first source control gates with gate terminals coupled to the first source control line, each of the first source control gates further having a drain terminal coupled to a respective one of the first and fourth sub-source lines, and a source terminal coupled to a respective one of the first and third main source lines; a second source control gate pair including second source control gates with gate terminals coupled to the second source control line, each of the second source control gates further having a drain terminal coupled to a respective one of the second and third sub-source lines, and a source terminal coupled to the second main source-line; a first drain control gate pair including first drain control gates with gate terminals coupled to the first drain control line, each of the first drain control gates further having a drain terminal coupled to a respective one of the first and fourth sub-bit lines, and a source terminal coupled to a respective one of the first and second main bit lines; and a second drain control gate pair including second drain control gates with gate terminals coupled to the second drain control line, each of the second drain control gates further having a drain terminal coupled to a respective one of the second and third sub-bit lines, and a source terminal coupled to a respective one of the first and second main bit lines.

According to another aspect of the present invention, a memory cell array comprises a matrix of basic circuits that include: first and second word lines; first and second source control lines; first and second drain control lines; first, second and third main source lines; first and second main bit lines; two rows and four columns of transistor cells, the transistor cells in each of the rows having gate terminals which are coupled to a respective one of the first and second word lines, the transistor cells in each of the columns having source terminals coupled to a respective one of first, second, third and fourth sub-source lines, and drain terminals coupled to a respective one of first, second, third and fourth sub-bit lines; a first source control gate pair including first source control gates with gate terminals coupled to the first source control line, each of the first source control gates further having a drain terminal coupled to a respective one of the first and third sub-source lines, and a source terminal coupled to a respective one of the first and second main source lines; a second source control gate pair including second source control gates with gate terminals coupled to the second source control line, each of the second source control gates further having a drain terminal coupled to a respective one of the second and fourth sub-source lines, and a source terminal coupled to a respective one of the second and third main source lines.

According to still another aspect of the present invention, a memory cell array comprises a matrix of basic circuits that include: first and second word lines; first and second drain control lines; first and second main bit lines; two rows and four columns of transistor cells, the transistor cells in each of the rows having gate terminals which are coupled to a respective one of the first and second word lines, the transistor cells in each of the columns having grounded source terminals, and drain terminals coupled to a respective one of first, second, third and fourth sub-bit lines; a first drain control gate pair including first drain control gates with gate terminals coupled to the first drain control line, each of the first drain control gates further having a drain terminal coupled to a respective one of the first and third sub-bit lines, and a source terminal coupled to a respective one of the first and second main bit lines; and a second drain control gate pair including second drain control gates with gate terminals coupled to the second drain control line, each of the second drain control gates further having a drain terminal coupled to a respective one of the second and fourth sub-bit lines, and a source terminal coupled to a respective one of the first and second main bit lines.

Preferably, each of the sub-bit lines and the sub-source lines is formed as a buried N+layer and is disposed between one of the main source lines and one of the main bit lines. Each of the transistor cells, the source control gates and the drain control gates can be an N-channel cell which requires a buried N+ layer or a P-channel cell which requires a buried P+ layer.

According to another aspect of the present invention, a method of programming a flash memory cell array having a plurality of word lines comprises:
 (a) deep programming a selected one of the word lines by applying a negative deep program voltage thereto;
 (b) applying a deep program verify voltage to the selected one of the word lines, and detecting threshold voltages of transistor cells coupled to the selected one of the word lines;
 (c) repeating step (a) if any of the threshold voltages is higher than the deep program verify voltage;
 (d) reverse programming the selected one of the word lines by applying a positive reverse program voltage thereto;
 (e) applying a reverse program verify voltage to the selected one of the word lines, and detecting the threshold voltages of the transistor cells coupled to the selected one of the word lines; and
 (f) repeating step (d) if any of the threshold voltages is lower than the reverse program verify voltage.

According to yet another aspect of the present invention, a method of erasing a flash memory cell array having a plurality of word lines comprises:
 (a) erasing a selected one of the word lines by applying a negative erase voltage thereto;
 (b) applying an erase verify voltage to the selected one of the word lines, and detecting threshold voltages of transistor cells coupled to the selected one of the word lines;
 (c) repeating step (a) if any of the threshold voltages is higher than the erase verify voltage;
 (d) applying an over-erase verify voltage to the selected one of the word lines, and detecting the threshold voltages of the transistor cells coupled to the selected one of the word lines;

(e) applying an over-erase repair voltage to the transistor cells that have threshold voltages which are lower than the over-erase verify voltage;

(f) applying a repair verify voltage to the selected one of the word lines, and detecting the threshold voltages of the transistor cells coupled to the selected one of the word lines; and (g) repeating step (e) if any of the threshold voltages is lower than the repair verify voltage.

According to yet another aspect of the present invention, a flash electrically erasable programmable read only memory comprises:

a memory cell array with bit-based write capability, the memory cell array including: a plurality of word lines; a plurality of source control lines; a plurality of drain control lines; a plurality of main source lines; a plurality of main bit lines; a matrix of transistor cells coupled to the word lines; a plurality of source control gates coupled to the source control lines, the transistor cells, and one of the main source lines and the main bit lines; and a plurality of drain control gates coupled to the drain control lines, the transistor cells, and one of the main source lines and the main bit lines;

read/write controller means including: master latch means for storing a new data pattern; sense amplifier means coupled to the main bit lines for reading original data stored in the transistor cells; data comparator means coupled to the master latch means and the sense amplifier means for comparing the original data with the new data pattern and for generating a corresponding erase/program pattern; and slave latch means for storing the erase/program pattern; and row decoder means including word line driver means coupled to the word lines, drain control line driver means coupled to the drain control lines, and source control line driver means coupled to the source control lines, the row decoder means being configured to provide a plurality of operational voltages to accomplish a read, program or erase operation for selected ones of the transistor cells in response to the erase/program pattern.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
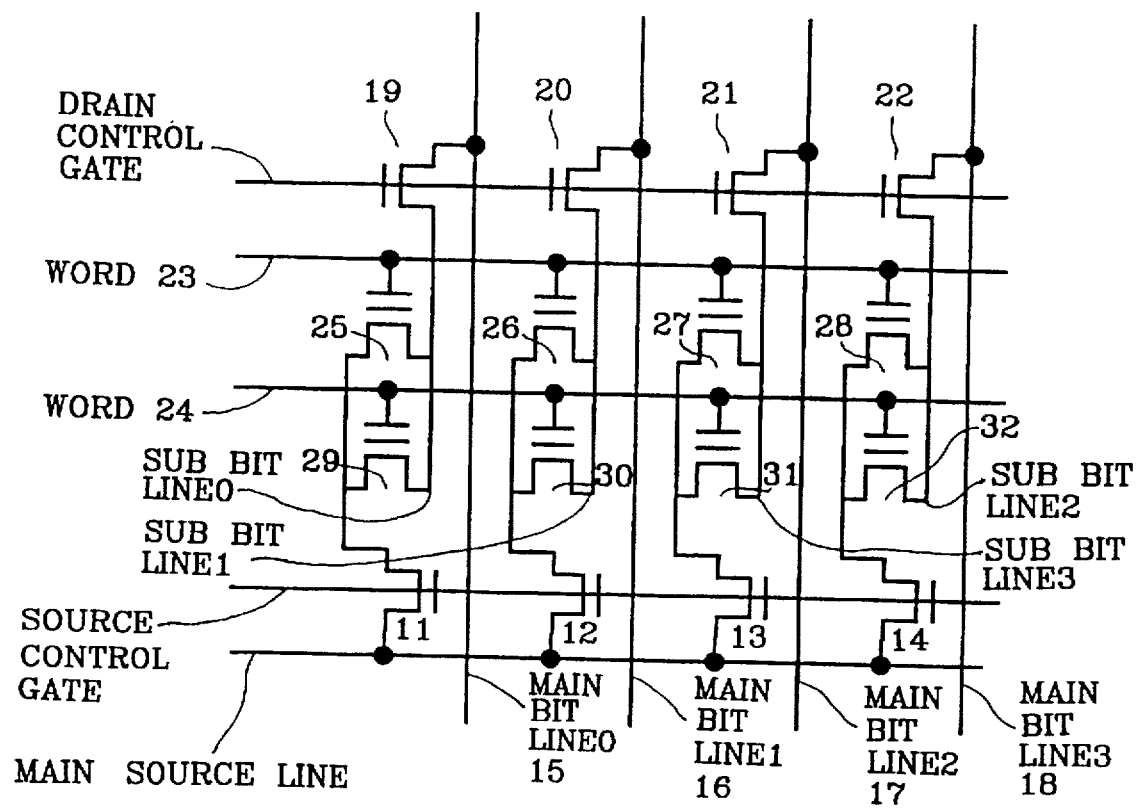
FIG. 1 illustrates a conventional AND-plane memory cell array for a flash EEPROM.
Figure 2:
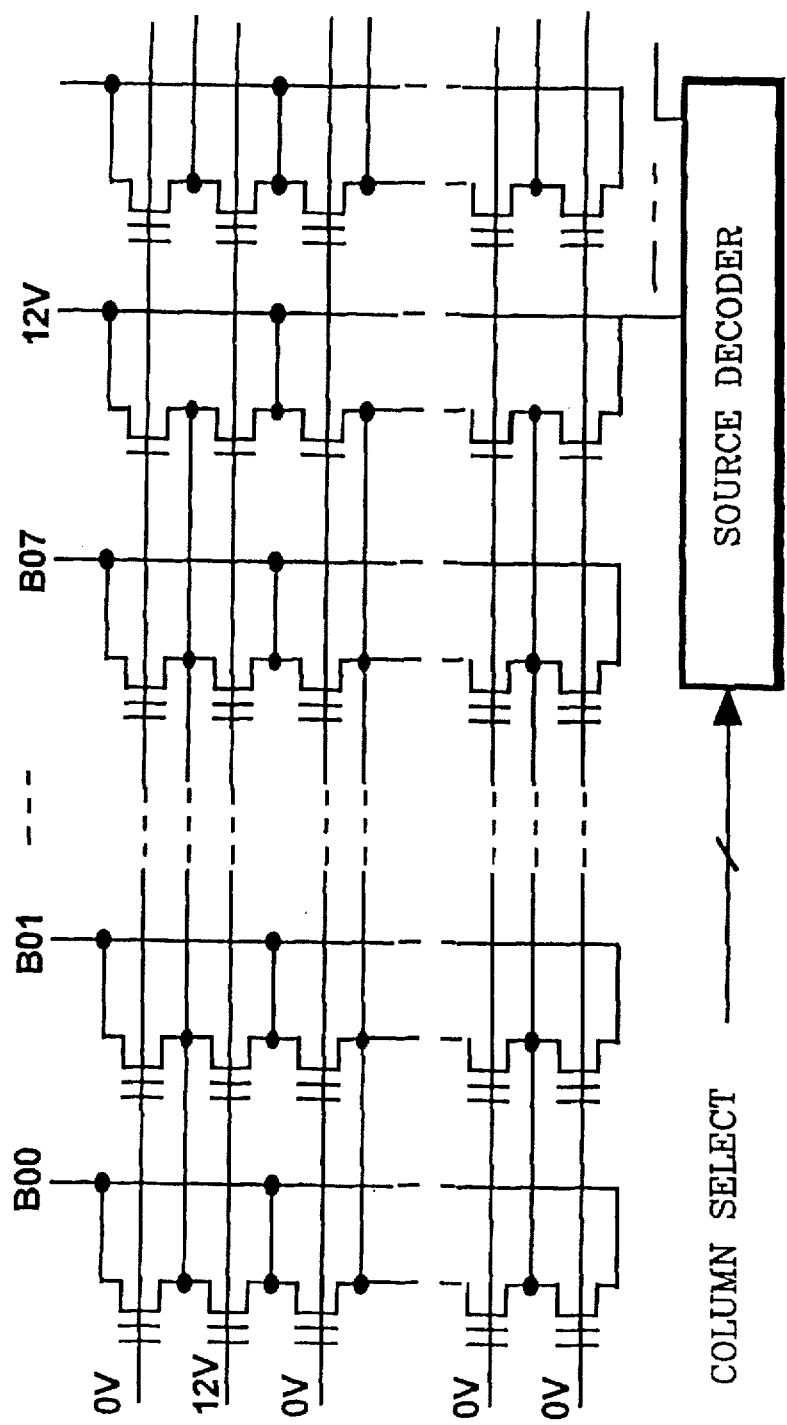
FIG. 2 illustrates a conventional NOR-plane memory cell array with byte-erase capability for a flash EEPROM.

Before this invention is described in greater detail, it should be noted that like elements are denoted by the same reference numerals throughout the disclosure.

Figure 3:
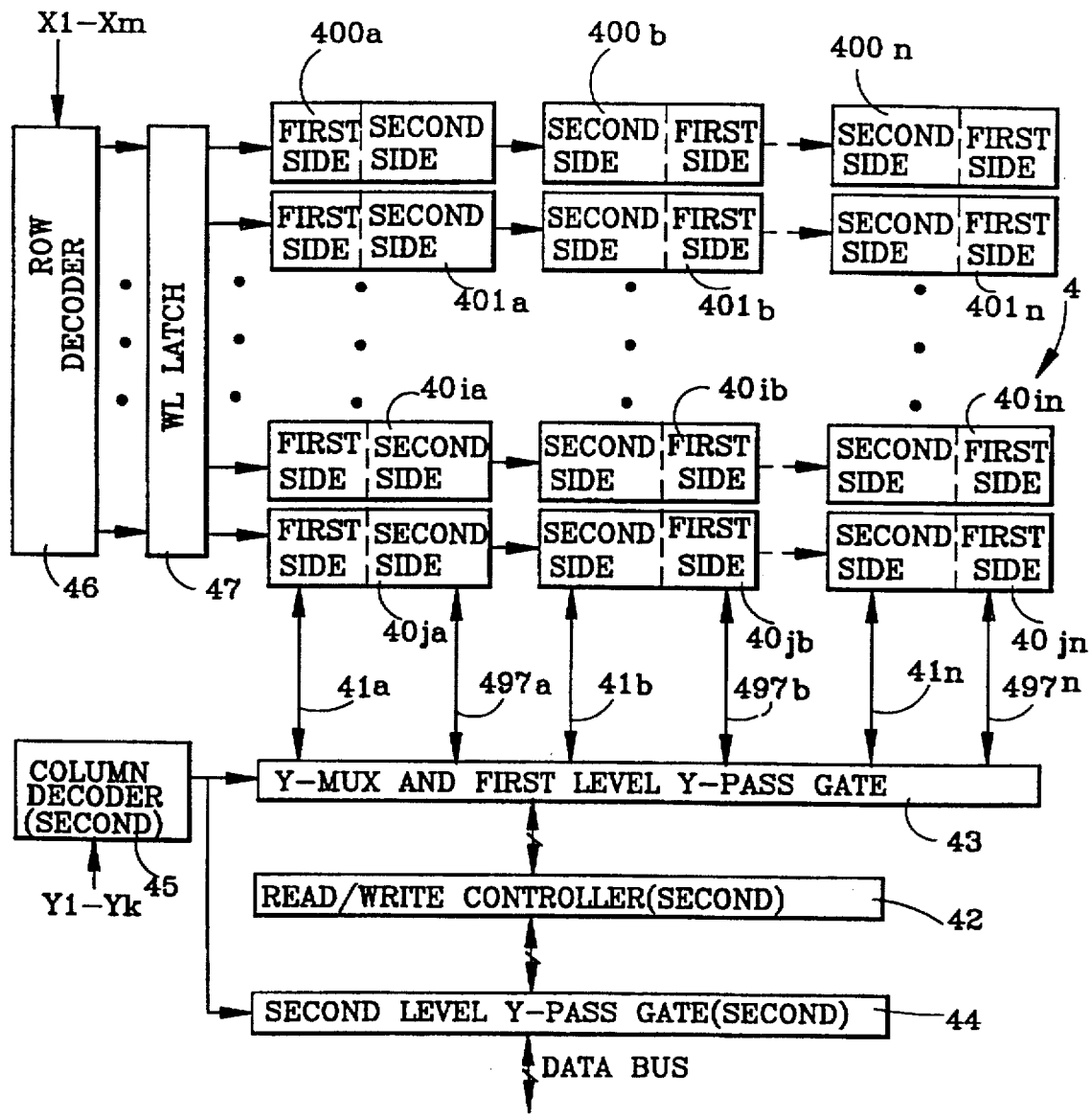
FIG. 3 is a functional block diagram of a flash EEPROM which incorporates the OR-plane memory cell array of this invention.

FIG. 3 illustrates a flash EEPROM which incorporates the first preferred embodiment of an OR-plane memory cell array 4 according to this invention. As shown, the flash EEPROM includes a row decoder 46 which receives address signals X1–Xm from an off-chip controller or internal sequencer (not shown), a word line latch 47 for coupling the row decoder 46 to the memory cell array 4, a column decoder 45 which receives address signals Y1–Yk from the off-chip controller or internal sequencer, a second level Y-pass gate 44 coupled to the data bus, a read/write controller 42 coupled to the second level Y-pass gate 44, and a Y-Mux and first level Y-pass gate 43 coupled to the column decoder 45, the memory cell array 4 and the read/write controller 42.

The memory cell array 4 is partitioned into k blocks, e.g. 400a to 40ja, in the column direction. Each block includes several rows of transistor cells. The non-selected blocks can be isolated from the selected blocks so that the former are unaffected by programming, erasing or reading operations that are performed on the latter. In addition, every pair of adjacent transistor cells in the row direction are grouped into first and second sides. The paired transistor cells share a main bit line, e.g. 41a to 41n, which is coupled to separated sub-bit lines of the transistor cells. Each sub-bit line is controlled by an associated control gate. Due to the shared main bit lines, the first and second side control gates cannot be turned on simultaneously, except when the erase segment is larger than or equal to one row.

If the read/write controller 42, which is responsible for sensing or writing a data pattern from or onto the main bit lines 41a to 41n, occupies some layout area, the memory cell array 4 can be further broken down into many segments by the Y-Mux and first level Y-pass gate 43. The Y-Mux and first level Y-pass gate 43 permits multiplexing of the main bit lines 41a to 41n so that the latter share the read/write controller 42. Also, since the read/write controller 42 is coupled to the data bus via the second level Y-pass gate 44, each row of the memory cell array 4 will be divided into at least two parts called sub-pages. The number of sub-pages is determined in accordance with the designated scheme and the final arrangement of the layout area.

Figure 4:
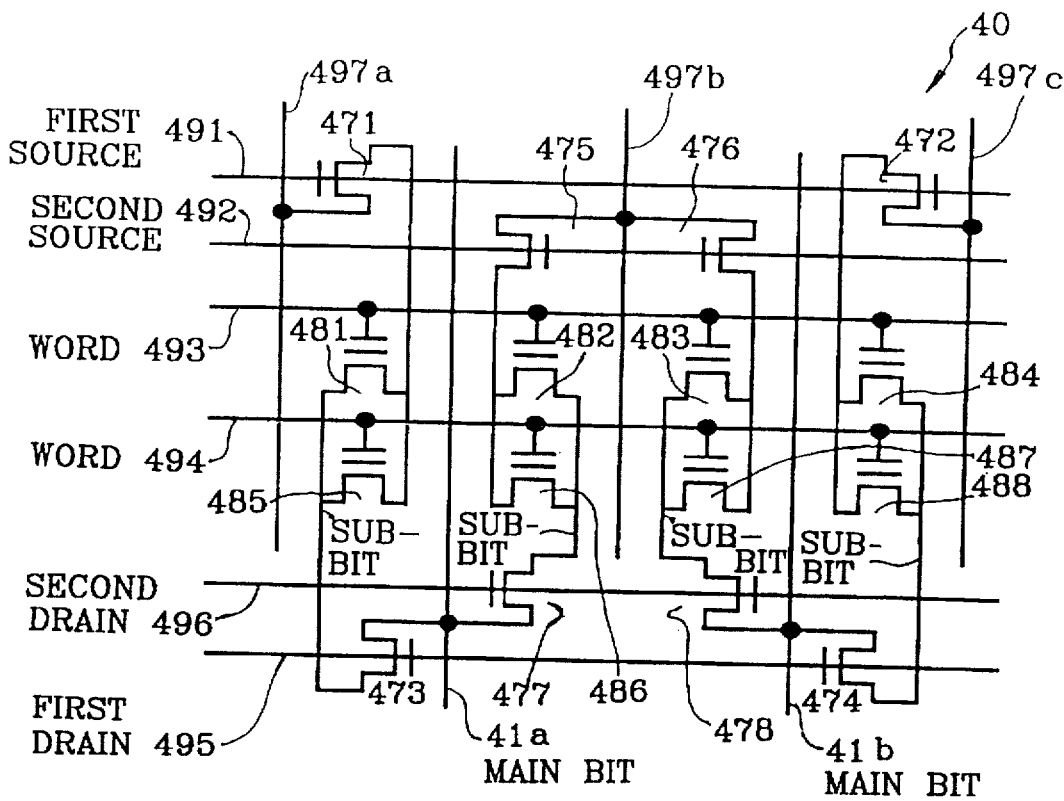
FIG. 4 illustrates a basic circuit of the first preferred embodiment of the OR-plane memory cell array according to this invention.

FIG. 4 is a schematic electrical circuit diagram of a basic circuit 40 of the first preferred embodiment of an OR-plane memory cell array 4 according to this invention. As shown, the basic circuit 40 includes two rows and four columns of transistor cells 481–488, a first source control gate pair 471, 472, a first drain control gate pair 473, 474, a second source control gate pair 475, 476, and a second drain control gate pair 477, 478. The transistor cells 481–488 in the same row have gate terminals which are coupled to one of two word lines 493, 494. The transistor cells 481–488 in the same column have source terminals coupled to a respective one of first to fourth sub-source lines, and drain terminals coupled to a respective one of first to fourth sub-bit lines. The first source control gates 471, 472 have gate terminals coupled to a first source control line 491, drain terminals coupled to a respective one of the first and fourth sub-source lines, and source terminals coupled to a respective one of first and third main source lines 497a, 497c. The second source control gates 475, 476 have gate terminals coupled to a second source control line 492, drain terminals coupled to a respective one of the second and third sub-source lines, and source terminals coupled to a second main source line 497b. The first drain control gates 473, 474 have gate terminals coupled to a first drain control line 495, drain terminals coupled to a respective one of the first and fourth sub-bit lines, and source terminals coupled to a respective one of first and second main bit lines 41a, 41b. The second drain control gates 477, 478 have gate terminals coupled to a second drain control line 496, drain terminals coupled to a respective one of the second and third sub-bit lines, and source terminals coupled to a respective one of the first and second main bit lines 41a, 41b.

Figure 5:
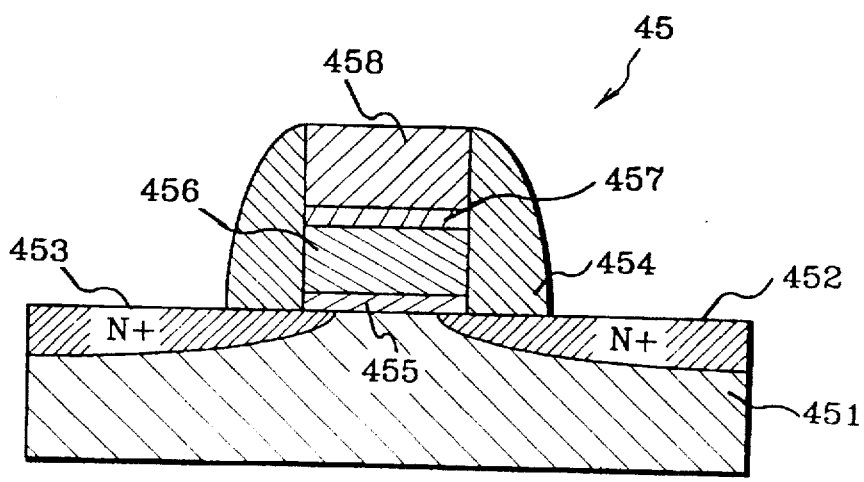
FIG. 5 is a cross-sectional view of an N-channel memory cell for the memory cell array of this invention.

FIG. 5 is a cross-sectional view of an N-channel memory cell 45 for the memory cell array 4 of this invention. The memory cell 45 includes a P-type substrate 451, an N-type diffusion layer 452 which constitutes the drain region, an N-type diffusion layer 453 which constitutes the source region, an insulator 454, a tunnel oxide layer 455, a floating gate 456 on the tunnel oxide layer 455, an insulating layer 457 formed by nitride-oxide-nitride and disposed on the floating gate 456, and a control gate 458 on the insulating layer 457.

Referring again to FIG. 4, note that the transistor cells in the column direction have sub-source and sub-bit lines which are not shared with the transistor cells in the adjacent columns. Thus, the threshold voltage of a transistor cell can be programmed to a lower or higher level without affecting the transistor cells in the adjacent columns due to the separate source and drain. In this invention, since both the erase and program operations can be bit-selective, increasing or decreasing the threshold voltage of a transistor cell can be deemed to be the erase or program operation. This is in contrast with the prior art, wherein the erase operation generally means that the operation is undertaken in a page or block size, while the program operation generally means that the operation is cell-selective.

Table I summarizes the bias conditions for the basic circuit 40 during read, erase and program operations when the erase operation is defined as an operation in which the threshold voltage of a transistor cell is increased, while the program operation is defined as an operation in which the threshold voltage is decreased:

TABLE I

| Lead | Serial Reading Cell 481 | Random Reading Cell 486 | Bit Erase Cell 487 | Flash Erase Cells 481 to 484 | Program Cell 488 |
|---|---|---|---|---|---|
| 491 | VDD | VDD | MV | 0 V | 0 V |
| 492 | VDD | VDD | 0 V | 0 V | MV |
| 493 | VDD | 0 V | MV | HV | 0 V |
| 494 | 0 V | VDD | HV | MV | −NV |
| 495 | VDD | 0 V | 0 V | MV | MV |
| 496 | 0 V | VDD | MV | MV | 0 V |
| 41a | Vs | Vs | MV | 0 V | 0 V |
| 41b | 0 V | 0 V | 0 V | 0 V | MV |
| 497a–497c | 0 V | 0 V | MV | 0 V | 0 V | where:

HV=High Voltage (12 to 15 volts)
MV=Medium Voltage (5 to 8 volts)
Vs=Bit Line Sense Voltage (1.2 volts)
−NV=Negative Voltage (−10 volts)

Table II summarizes the bias conditions for the basic circuit 40 during the read, erase and program operations when the erase operation is defined as an operation in which the threshold voltage is decreased, while the program operation is defined as an operation in which the threshold voltage is increased:

TABLE II

| Lead | Serial Reading Cell 481 | Random Reading Cell 486 | Bit Erase Cell 487 | Flash Erase Cells 481 to 484 | Program Cell 488 |
|---|---|---|---|---|---|
| 491 | VDD | VDD | MV | 0 V | 0 V |
| 492 | VDD | VDD | 0 V | 0 V | MV |
| 493 | VDD | 0 V | 0 V | −NV | HV |
| 494 | 0 V | VDD | −NV | 0 V | MV |
| 495 | VDD | 0 V | 0 V | MV | MV |
| 496 | 0 V | VDD | MV | MV | 0 V |
| 41a | Vs | Vs | 0 V | MV | MV |
| 41b | 0 V | 0 V | MV | MV | 0 V |
| 497a–497c | 0 V | 0 V | 0 V | 0 V | MV |

Figure 6:
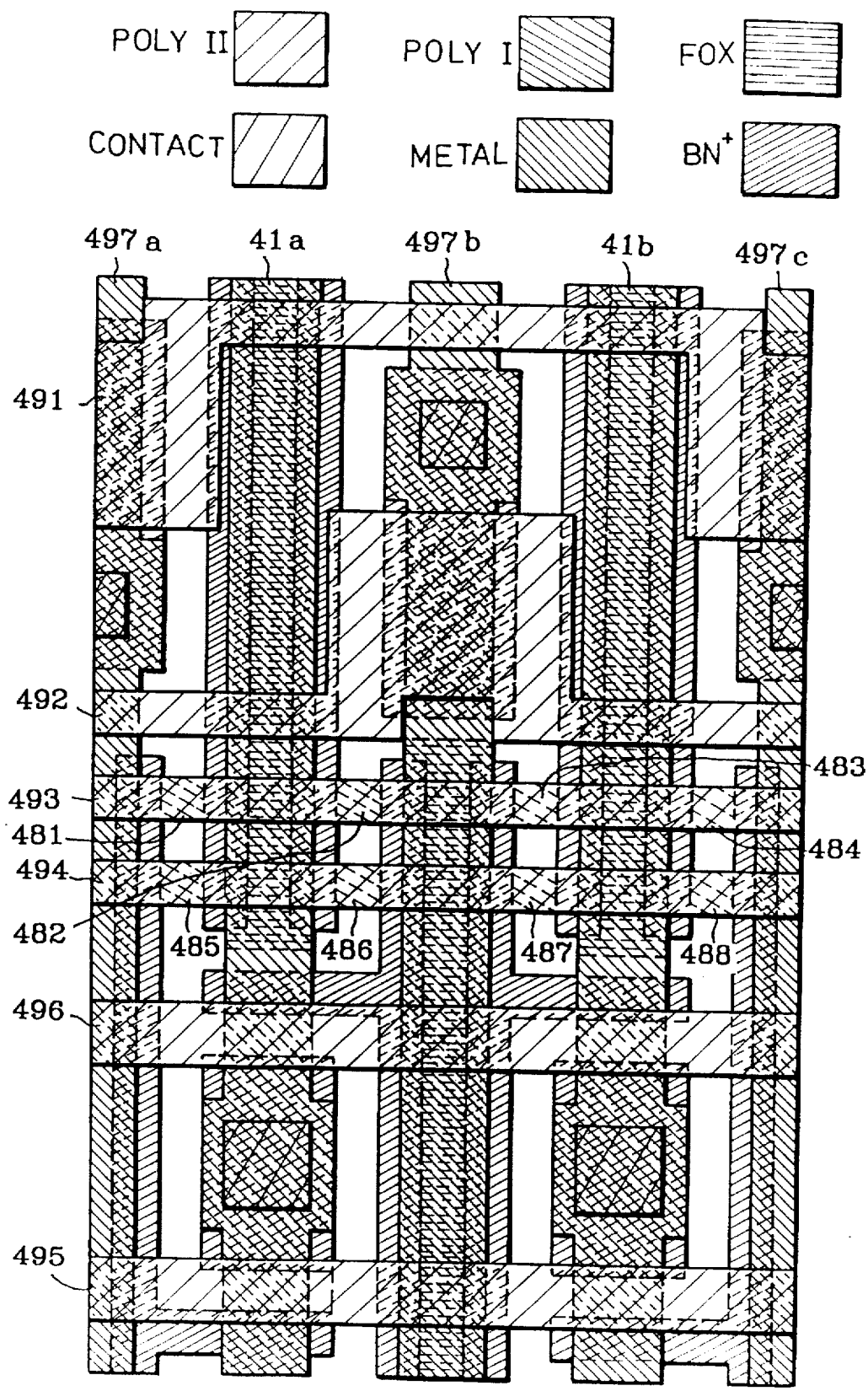
FIG. 6 is a plan view of the basic circuit shown in FIG. 4.

FIG. 6 illustrates a plan view of the basic circuit 40 which includes the transistor cells 481–488, the source control gates, and the drain control gates. Each transistor cell 481-488 is self-aligned with a buried N+ source and drain, and the field oxide serves to isolate each transistor cell.

Figure 7:
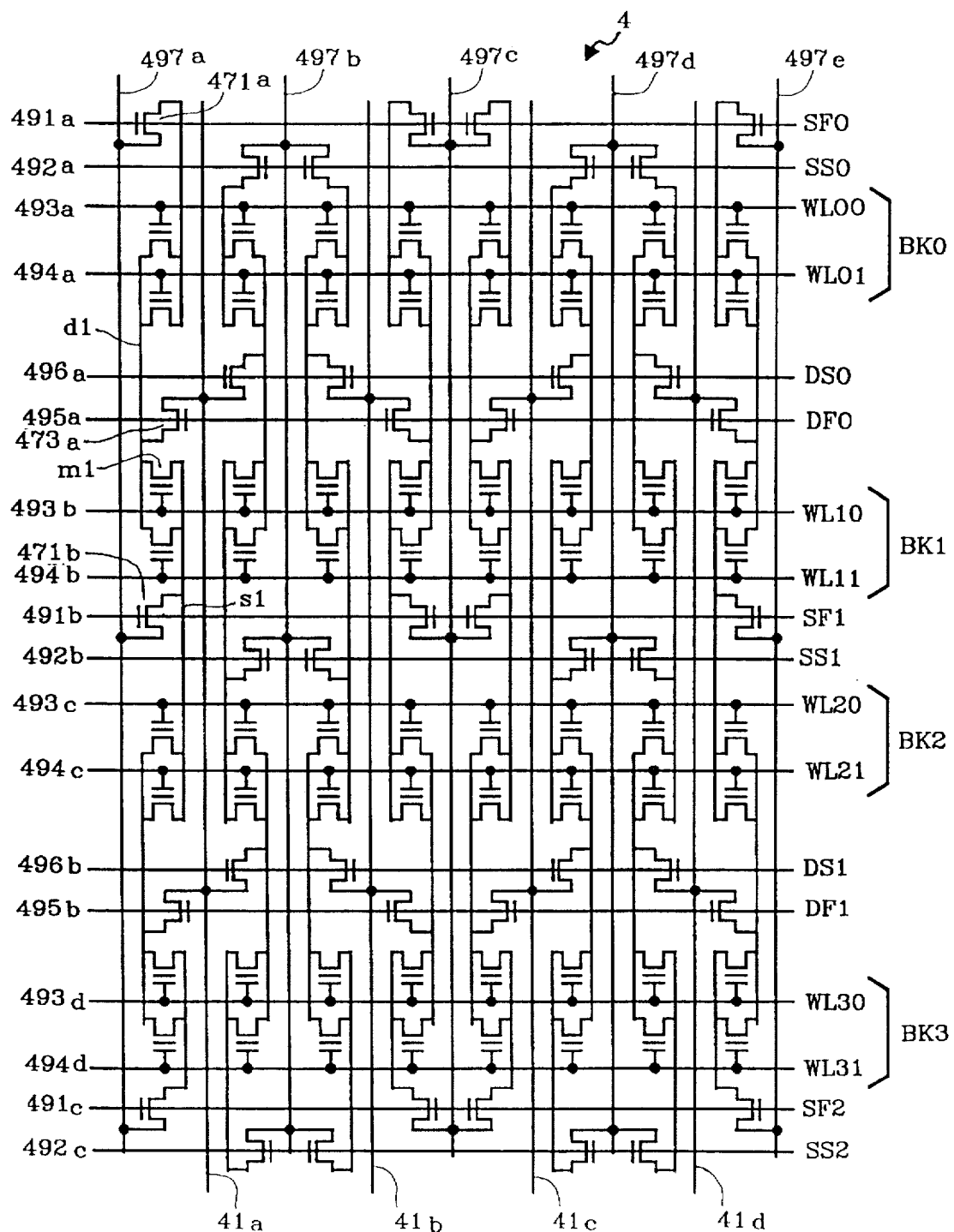
FIG. 7 illustrates the OR-plane memory cell array according to the first preferred embodiment.

Referring to FIG. 7, the basic circuit 40 of FIG. 4 is expanded two-fold in the row direction, and four-fold in the column direction. The sub-bit lines (e.g. d1) and the sub-source lines (e.g. s1) are each made of buried N+ (BN+) layers, which are contactless strips. Compared with the conventional NOR-plane memory cell array, savings in the layout area can be attained. Because the total resistance of the BN+ layer present on both the drain and source side of some of the transistor cells (e.g. m1) is fixed, the access time for random reading is approximately the same for all transistor cells. However, the resistance of the BN+ layer in this invention has the same fixed value compared to that of the conventional AND-plane memory cell array if the number of transistor cells in a block of the former is equal to that in a block of the latter. Although the length of the BN+ strip will seem to be twice that of the conventional AND-plane memory cell array, the shared control gates (e.g. 473a, 471b) in the midst of the BN+ strip cuts both the drain and source resistances into half.

There are two types of read operations that can be performed: the random byte-read and the serial sub-page read. The bias conditions for the two read operations are shown in Tables I and II. With reference to FIG. 4, in the random byte-read format, each main source line 497a, 497b, 497c is tied to the ground level due to concerns about noise immunity. The ground level source lines 497a, 497b, 497c serve as a shield against noise from adjacent main bit lines 41a, 41b. Therefore, the access time for the selected byte will be improved significantly. In the sub-page read format, data of the selected sub-page is read and stored in the read/write controller 42 (see FIG. 3). The time for collective read depends mostly upon the design requirement of the sense amplifier of the read/write controller 42 in view of the fact that current takes time to accumulate during the sensing step. The subsequent step of serially clocking out the stored data is performed under the condition that the sense amplifier is shut off, and can be easily achieved with the use of a high speed serial clock.

Referring once more to FIG. 4, when reading transistor cell 486, the VDD voltage is applied to the word line 494, while the non-selected word line 493 is grounded. The VDD voltage is further applied to the first and second source control lines 491, 492 and to the second drain line 496. The first drain line 495 is grounded. As such, only the appropriate BN+ strip will be coupled to the main bit line 41a. Therefore, the junction capacity is reduced significantly as compared to that of the conventional NOR-plane memory cell array. Note also that the adjacent main source lines 497a, 497b are tied to ground level to provide shielding against noise from the adjacent main bit line 41b. Therefore, it is obvious that the OR-plane memory cell array 4 has improved speed as compared to the conventional AND-plane memory cell array.

Basically, the erase operation can be classified as flash-type erase and non-flash-type erase. Sub-page erase, page erase, multiple-page erase, block erase, multiple-block erase and chip erase can be considered as various forms of flash erase. The erase enable patterns are initiated in the read/write controller 42 (see FIG. 3) by a short activating pulse. However, the non-flash-type erase, which combines both erase enable and inhibit patterns, needs time to load the required patterns into the read/write controller 42. In the memory cell array 4 of FIG. 3, the flash-type erase is used as a time saving measure in which the same erase pattern is applied to all main bit lines 41a-41n. However, it should be noted that only a part of the main bit lines 41a-41n is applied with the erase pattern during sub-page erase. The non-flash-type erase has an enhanced endurance when compared with the flash-type erase since the erase inhibit voltage can be applied selectively to the transistor cells. Moreover, the bit-based erase capability obviates the need for an extra memory device for rewriting data back into non-selected ones of the transistor cells during the erase operation as taught in the prior art.

Selective bit-erasure and bit-programming of the basic circuit 40 of FIG. 4 is performed as follows. Referring to Table I and to FIG. 4, assuming that the main bit lines 41a, 41b share a common read-write controller 42 which has the erase pattern loaded therein, and assuming that the erase operation is defined as the raising of the threshold voltage of a transistor cell, when bit-erasure of the transistor cell 487 is to be performed, the other transistor cells 485, 486, 488 on the same row should be erase-inhibited. The first source control line 491 is applied with the medium voltage while the second source control line 492 is grounded. The high voltage is applied to the selected word line 494. The transistor cell 486 is erase-inhibited by the medium voltage which is applied to the main bit line 41a via the Y-Mux and first level Y-pass gate 43 (see FIG. 3). The transistor cells 485, 488 are erase inhibited by the medium voltage that is applied at the main source lines 497a, 497b, 497c. The transistor cell 487 is erase-enabled by the ground voltage from the main bit line 41b and which is transferred to the corresponding sub-bit line by the drain control gate 477 due to the medium voltage at the second drain line 496. The first drain line 495 is grounded.

While the non-selected word line 43a may be applied with the ground voltage, such an application is easily susceptible to drain disturbance. A better alternative would be to apply the medium voltage to the non-selected word line 43a. Under the aforementioned bias conditions, only the transistor cell 487 will be erased while the other transistor cells of the basic circuit 40 will be kept in their original states.

Referring to Table I and to FIG. 4, assuming that the program operation is defined as the lowering of the threshold voltage of a transistor cell, the program patterns are loaded into the read/write controller 42 (see FIG. 3), and all word lines are reset to logic high, except for the selected word line which is set to logic low. During programming, the selected word line will be gradually ramped from 0 volts to the negative voltage so that charges can be drawn out from the floating gate to the drain of the selected transistor cells. The non-selected word lines may be kept at the logic high voltage (e.g. 5 volts) so that, whenever the drain voltage of the non-selected transistor cell is applied with the program enable voltage (e.g. 5 volts), the electric field between the drain and the gate will be substantially reduced to prevent drain disturbance. In addition, the gate disturbance as compared with the erase voltage (e.g. 12 to 15 volts) will be relatively small. Alternatively, the drain voltage of the non-selected transistor cell may be switched from VDD (e.g. 5 volts) to 0 volt whenever the negative voltage is pumped to −5 volts. For the word line drivers this results in the advantage of releasing stress between the gate and the junction. However, the present invention is based on the F-N tunneling scheme without the high implant doping on both the source and drain sides. Due to the small F-N tunneling current, e.g. 10–1000 pA for one transistor cell, this programming scheme is useful for low power applications.

A more detailed description of the bit-programming operation is provided as follows. Referring to Table I and to FIG. 4, assuming that bit-programming of the transistor cell 488 is to be performed, the program inhibit voltage of 0 volts will be applied to either the source side or the drain side of the other non-selected transistor cells 485, 486, 487 on the same row. The medium voltage is applied to the second source control line 492, while the ground voltage is applied to the first source control line 491. The negative voltage is applied to the selected word line 494, the medium voltage is applied to the first drain line 495, and the ground voltage is applied to the second drain line 496. As such, the transistor cell 485 is program-inhibited by the ground voltage issued from the Y-Mux and first level Y-pass gate 43 (see FIG. 3) and received via the drain control gate 473. The transistor cells 486, 487 are program-inhibited by the ground voltage that is applied to the main source lines 497a, 497b, 497c. The program enable voltage (e.g. 5 volts) on the main bit line 41b can be transferred onto the transistor cell 488 via the drain control gate 474 and the associated sub-bit line.

While using the negative gate voltage for programming, the hot hole injection into the tunneling oxide can cause degradation. Thus, endurance is decreased by this kind of trapping mechanism. Further, assuming that the acceptable programmed threshold voltage (Vt) distribution is within a maximum voltage Vtmax and a minimum voltage Vtmin, due to the distribution of the grain boundaries in the floating gate poly silicon film, the energy barrier height between the floating gate and the tunneling oxide will spread. The fastest cells have the lowest energy barrier height to overcome between the floating gate and the drain side. In contrast, the slowest cells have the highest energy barrier height to overcome between the floating gate and the drain side. Thus, the programmed Vt distribution will become wide to the extent that some threshold voltages will be seriously low (over-program Vt≦Vtmin) if there is no iteration of the verification and program operations, which iteration is taught in the prior art, to prevent the fastest cells from reaching the over-program state.

However, the hot hole trapped in the tunneling oxide is still not solved by the prior art. This is due to the fact that no de-trapping operation is employed in the prior art.

In this invention, the de-trapping operation is a program repair operation which is done by applying a positive high voltage to the control gate of the transistor cell iteratively. The program repair operation will recover the threshold voltage of the over-programmed transistor cell to the acceptable range. Further, the Vt distribution of the repaired transistor cell will be narrower because the distribution of the energy barrier between the drain side (silicon) and the tunnel oxide (silicon dioxide) is small. Also, the characteristics of the de-trapping operation, namely good convergence of the Vt distribution and the ability to eliminate trapped holes, make this operation useful for multi-level cells that need tightening of the Vt distribution. The operation of using a positive high voltage to program different levels of Vt will be hereinafter named as reverse program. Thus, the program operation in this invention can be separated into two major steps. The first step involves deep program which requires application of the negative voltage to the control gate. The coarse iteration algorithm is employed to verify whether the threshold voltage is smaller than the required value. The second step is the aforementioned reverse program which uses a positive high voltage on the control gate. The accurate iteration algorithm is used to verify whether the threshold voltage is larger than the required value.

In the program operation of this invention, Vtmax can be used as the deep program verify voltage, while Vtmin can be used as the reverse program verify voltage. As mentioned beforehand, the de-trapping operation for over-programmed transistor cells eliminates hot holes in the tunneling oxide. Also, as compared with the prior art, the accurate iteration algorithm is provided for the reverse program step. However, as the aforesaid threshold voltage distribution is related to the energy barrier height between two different materials, an increase in the overhead for verification is encountered in the prior art as the accuracy of the iteration algorithm is increased to prevent over-programming. In this invention, over-programming is not an issue. Thus, the accurate iteration algorithm used in the reverse program step does not require too many steps as taught in the prior art.

Since the transistor cells with threshold voltages within Vtmin and Vtmax do not have the efficient de-trapping operation due to the program inhibit voltage that is applied to the drain side, it is proposed that Vtmin be used as both the deep program verify voltage and the reverse program verify voltage. Thus, trapped holes will be eliminated from each programmed transistor cell during the reverse program step. However, the use of Vtmin as the deep program verify voltage will result in a longer verifying time.

Figure 8:
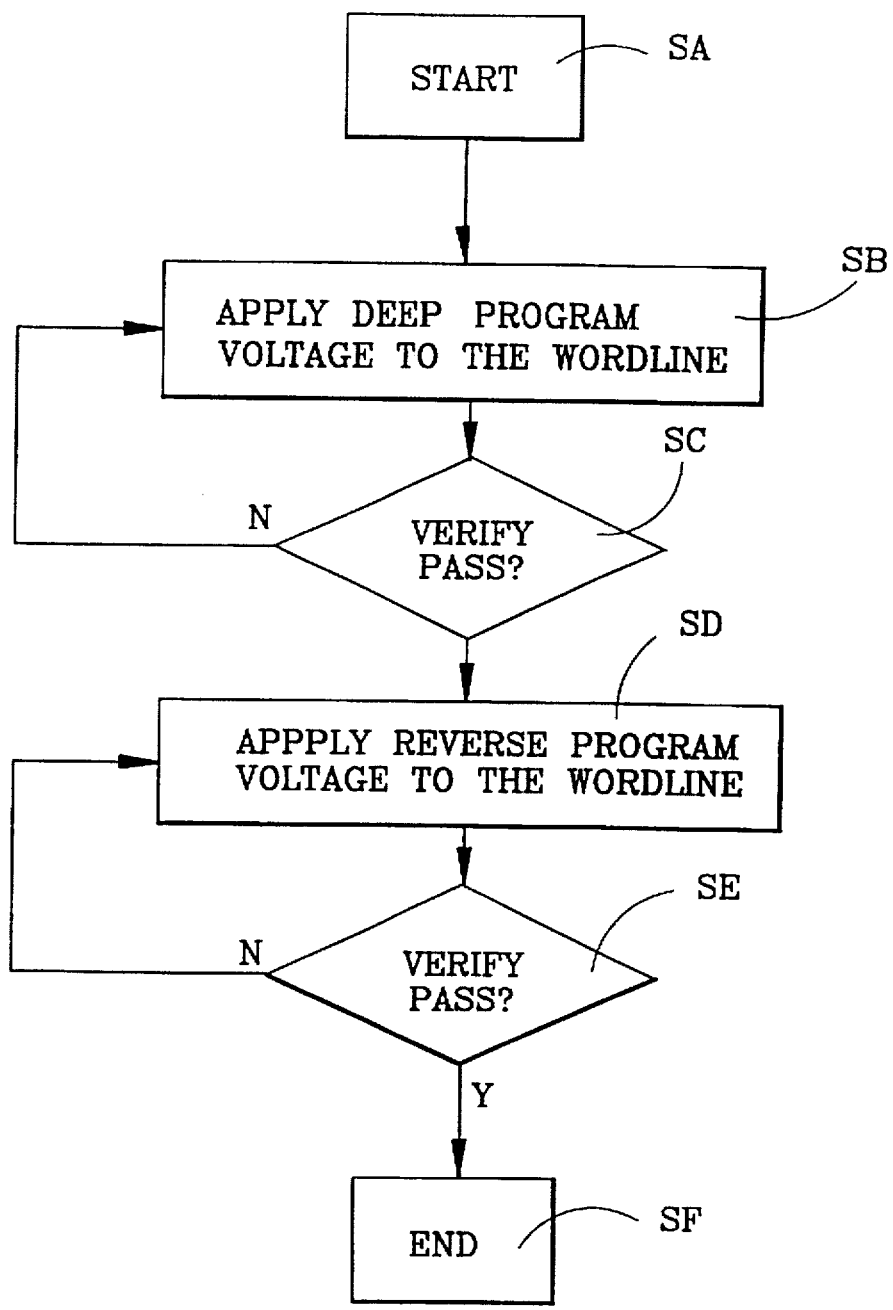
FIG. 8 illustrates a flowchart of the programming method of this invention.

FIG. 8 illustrates a flowchart of the program operation of this invention. As shown, the program setup block (SA) is encountered upon reception of the flash EEPROM of a program command and the row address to be programmed from an off-chip controller. After the required data pattern has been loaded sequentially to the read/write controller and has been latched thereby, the deep program block (SB) is encountered in which the selected word line is pumped to a negative voltage (e.g. −10 volts), and in which the selected bit line is applied with a high voltage (e.g. 5 volts). The deep program verify block (SC) is then encountered. As mentioned beforehand, the verify voltage can be set to Vtmax or Vtmin. If the threshold voltages of all of the transistor cells on the selected word line are lower than the verify voltage, the reverse program block (SD) is encountered. Otherwise, the deep program block (SB) is encountered anew. At the reverse program block (SD), the selected word line is pumped to a positive high voltage (e.g. 12–15 volts). Thereafter, the reverse program verify block (SE) is encountered. The program operation is terminated (SF) if the threshold voltages of all of the transistor cells on the selected word line are higher than the verify voltage. Otherwise, the program inhibit voltage will be applied to the drain side of the successfully programmed transistor cell to prevent drawing of charges therefrom, and the reverse program block (SD) is encountered anew until all of the transistor cells have been programmed successfully.

In the program operation of this invention, the number of iterations for either the deep program block or the reverse program block preferably has a predetermined count. Thus, the program operation can be terminated when the predetermined count is reached, meaning that a program failure condition has been detected.

When applying the program operation of this invention to a multi-level transistor cell, the deep program step will be performed at the first stage, while the reverse program step will be repeated at different stages. For example, if the Vt distribution has four states, then the reverse program iteration step will be performed four times, one for each of the states. A detailed description of the bit-based programming procedure for multi-level cells can be found in the co-pending U.S. patent application Ser. No. 08/611,600, entitled "Flash Memory Read/Write Controller," and filed on Jun. 17, 1996, the disclosure of which is incorporated herein by reference.

Figure 9:
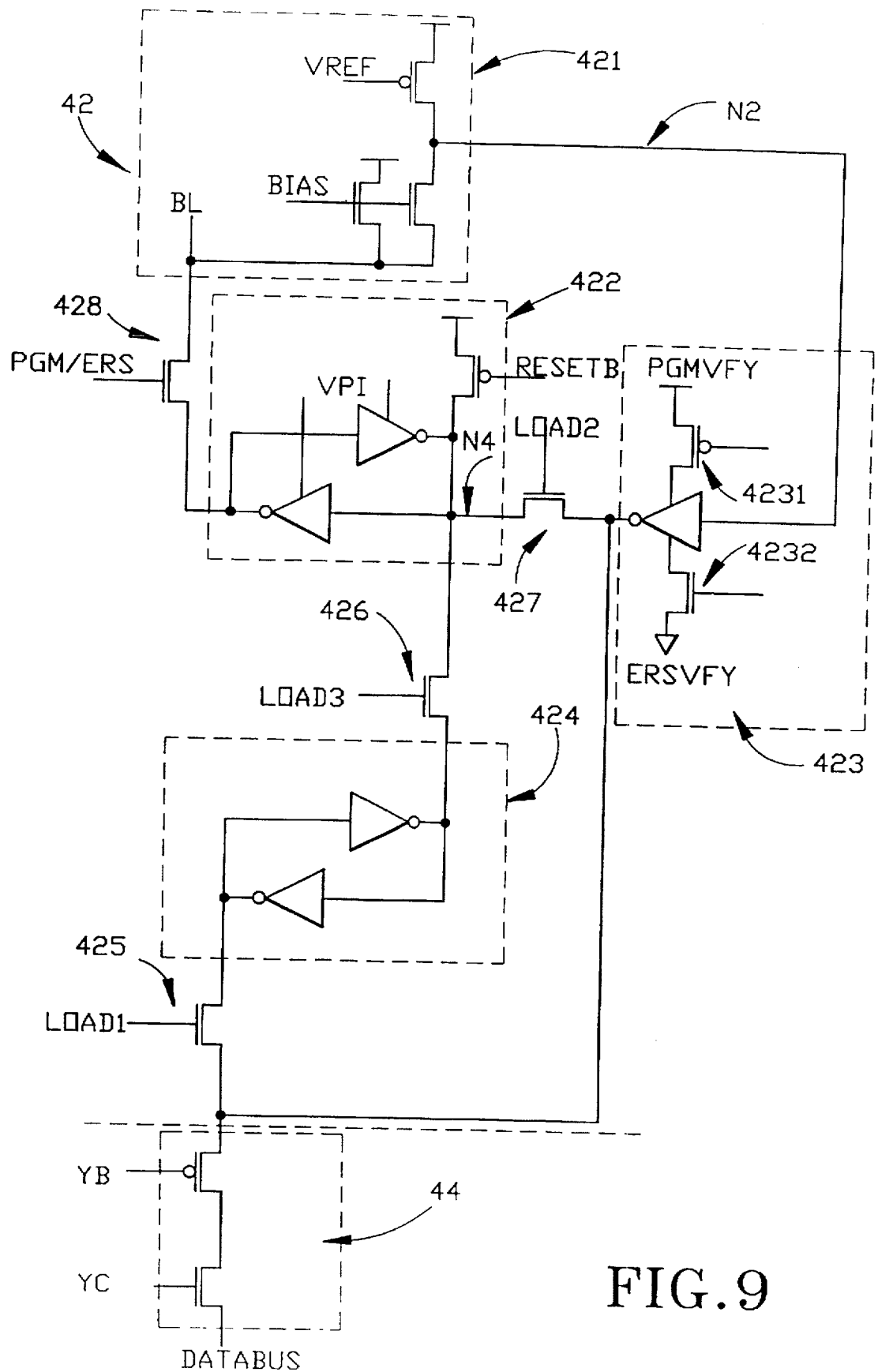
FIG. 9 illustrates a read/write controller for the memory cell array of this embodiment.

Referring to FIG. 9, the read/write controller 42 disclosed in the co-pending U.S. patent application Ser. No. 08/611, 600, is shown to comprise a sense amplifier 421, a slave latch 422, a data comparator 423 and a master latch 424. The master latch 424 is used to store a new data pattern. The sense amplifier 421 is used to read the original data of a corresponding transistor cell. The data comparator 423 is used to compare the original data with the new data pattern and generates an erase/program pattern. The slave latch 422 is used to store the erase/program pattern for subsequent operations. A detailed description of the operation of the read/write controller 42 can be found in the co-pending U.S. patent application Ser. No. 08/611,600.

A complete bit-based writing operation contains nine steps. These steps proceed internally and automatically under the control of the read/write controller 42 instead of an off-chip controller. In the following description of the writing steps, an erase operation is defined as one which increases the threshold voltage of a transistor cell, while a program operation is defined as one which decreases the threshold voltage of the transistor cell.

Step 1. Loading new data—New data is loaded into both the master latch 424 and the slave latch 422 by turning on the pass gates 425, 426 and by turning off the pass gates 427, 428.

Step 2. Generating an erase pattern—The new data stored in the slave latch 422 is compared with the original data read by the sense amplifier 421 to determine the erase pattern. The erase pattern is stored in the slave latch 422 and is sent to the bit lines in preparation for an erasing operation. The new data remains stored in the master latch 424 and can be used to generate a program pattern at a later stage.

The data comparator 423 includes first and second gates 4231, 4232. During the erase pattern generating step, the first and second gates 4231, 4232 are set up as off and on, respectively. If the original data N2 is a logic "1" high (erased), the new data N1 will be flipped to "1" for erase inhibition. If the original data N2 is a logic "0" low (programmed), the new data N1 will not be changed and remains at "0" for erasing and "1" for erase inhibiting.

Step 3. Erase—The data in the slave latch 422 passes to the data line (BL) as the pass gate 428 is turned on, and a high voltage pulse (about 15 volts) is applied to the selected word line to erase the selected transistor cell.

Step 4. Erase verify—After the selected transistor cell has been erased, a verify voltage is applied to the selected word line to check if the threshold voltage of the selected transistor cell is higher than the verify voltage. The set up of the data comparator 423 is the same as that during the erase pattern generating step, where the first and second gates 4231, 4232 are off and on, respectively. If the erase operation was successful, then the data in the selected transistor cell was changed from "0" (programmed) to "1" (erased). The previous erase pattern "0" stored in the slave latch 422 will be flipped to "1" for erase inhibition. Otherwise, the erase pattern will be kept unchanged.

Figure 10:
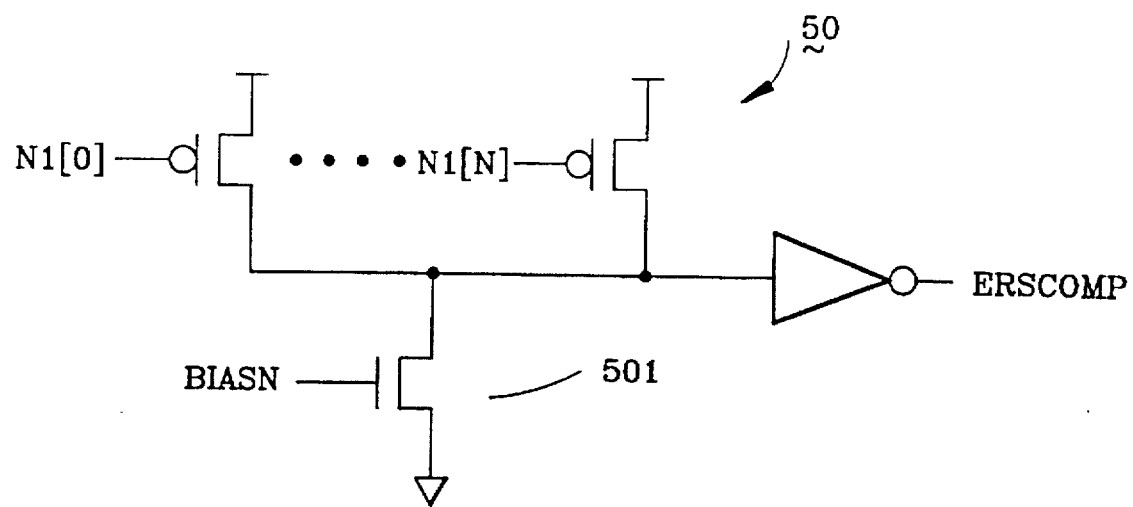
FIG. 10 illustrates a verification circuit for checking if an erase operation of the memory cell array was successful.

FIG. 10 illustrates a verification circuit 50 for checking if all the selected cells on the pages N1[0], N1[1], ..., N1[n] of the memory cell array have been erased successfully. The NMOS load 501 controlled by the BIASN signal has a large resistance. Only when the data of all of the selected transistor cells are at the logic "1" high (erased) will the ERSCOMP signal change to "0" to inform a status register (not shown) that the erase operation has been completed, and that the next step can be initialized. Otherwise, the erase and erase verify steps will be repeated.

Step 5. Generating a program pattern—The program operation is started immediately after completion of the erase operation. Initially, the program pattern is determined by turning on the pass gate 426 so that the desired new data stored in the master latch 424 can be loaded once more into the slave latch 422. The first and second gates 4231, 4232 of the data comparator 423 are set up as on and off, respectively. If the read data N2 is a logic "0" low (programmed), the new data N1 will be flipped to "0" for program inhibition. If the read data N2 is a logic "1" high (erased), the new data N1 will not be changed and remains at "1" for programming and "0" for program inhibiting.

Step 6. Deep program—The data in the slave latch 422 passes to the data line (BL) as the pass gate 428 is turned on, and a negative high voltage pulse (about −10 volts) is applied to the selected word line to deep program the selected transistor cell.

Step 7. Deep program verify—After deep programming the selected transistor cell, a verify voltage is applied to the selected word line to check if the threshold voltage of the selected transistor cell is lower than the verify voltage. The set up of the data comparator 423 is the same as that in the program pattern generating step, where the first and second gates 4231, 4232 are on and off, respectively. If the deep program operation was successful, then the data in the selected transistor cell was changed from "1" (erased) to "0" (programmed). The previous program pattern "1" stored in the slave latch 422 will be flipped to "0" for program inhibition. Otherwise, the program pattern will be kept unchanged.

Step 8. Reverse program—The data in the slave latch 422 will be changed whenever the threshold voltage is smaller than the reverse program verify voltage. Thus, new data patterns are set up for the reverse program operation. There will be a high voltage pulse (about 15 volts) applied to the selected word line to program the appropriate transistor cell in the reverse direction.

Step 9. Reverse Program Verify—After reverse programming the selected transistor cell, the verify voltage is applied to the selected word line to check if the threshold voltage of the selected transistor cell is higher than the verify voltage. The data comparator 423 is set up such that the first and second gates 4231, 4232 are off and on, respectively. If the reverse program operation was successful, then the data in the selected transistor cell was changed from "0" 1 (deeply programmed state) to "1" (reversely programmed state). The previous program pattern "1" stored in the slave latch 422 will be flipped to "0" for program inhibition. Otherwise, the program pattern will be kept unchanged.

It should be noted that, while the read voltage is applied to the word line, the programmed data will be read as "0" 1 since the reverse program verify voltage is lower than the read voltage. As such, over-programmed cells can be eliminated in this step.

Figure 11:
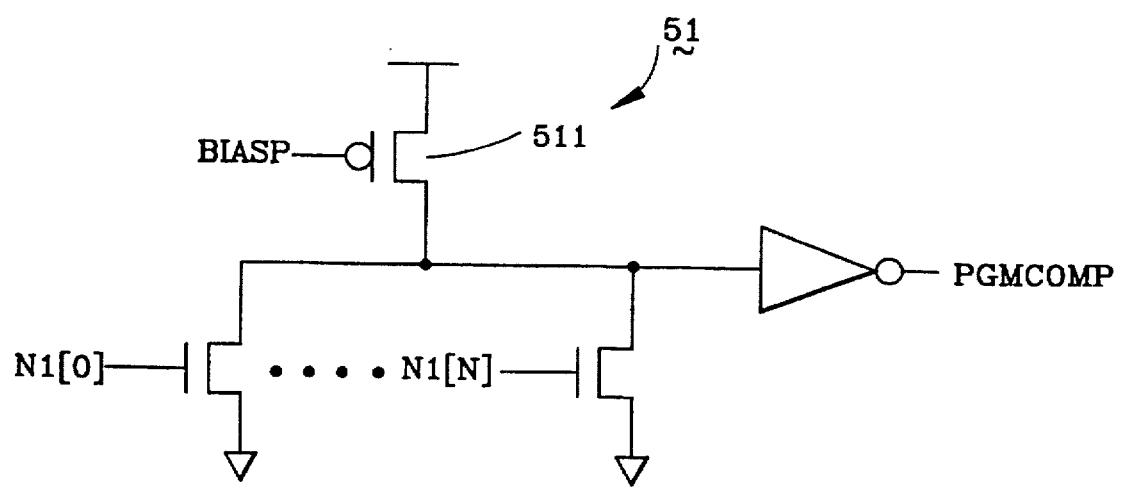
FIG. 11 illustrates a verification circuit for checking if a program operation of the memory cell array was successful.

FIG. 11 illustrates a verification circuit 51 for checking if all the selected transistor cells on the pages N1[0], N1[1], ..., N1[n] of the memory cell-array have been programmed successfully. The PMOS load 511 controlled by the BIASP signal has a large resistance. Only when the data of all of the selected transistor cells are at the logic "0" low (programmed) will the PGMCOMP signal change to "1" to inform the status register that the program operation has been completed. Otherwise, the program operation will be repeated.

The procedure for the other bit-based write operation, where increasing the cell threshold voltage is defined as a programming operation while decreasing the cell threshold voltage is defined as an erasing operation, is substantially similar to the aforesaid except for the different bias conditions that are in use. However, collective erasure for this approach needs to take the issue of over-erasing into consideration. The recovery of over-erased transistor cells in this invention will be described in greater detail in the succeeding paragraphs.

Figure 12:
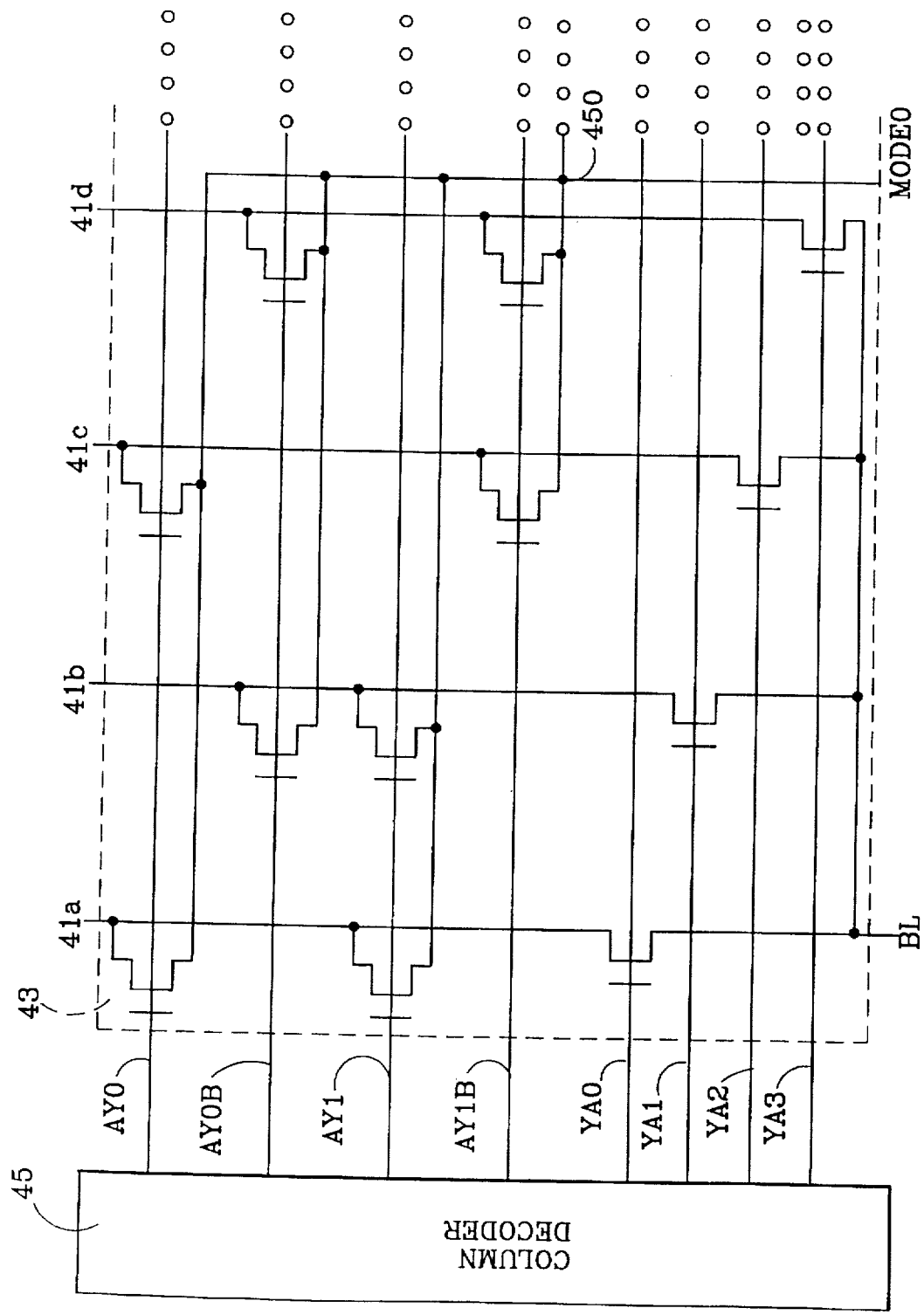
FIG. 12 illustrates a column decoder and a Y-Mux and first level Y-pass gate of the flash EEPROM shown in FIG. 3.

FIG. 12 illustrates the Y-Mux and first level Y-pass gate 43 of FIG. 3. Due to the design of the Y-Mux and first level Y-pass gate 43, the non-selected bit lines will not be at a floating state but will instead be at a solid state (MODEO) from line 450. When reading a transistor cell on a newly selected bit line, the access time will be affected by the unknown state of the non-selected bit lines if no Y-Mux and first level Y-pass gate 43 is installed. As such, the inhibit voltage for the erase or program operation can be applied to the non-selected bit lines to achieve the bit-based write capability. The main bit lines 41a–41d are from the OR-plane memory cell array 4 (see FIG. 3), and the data line (BL) is coupled to the read/write controller 42. In the circuit diagram of FIG. 12, the solid state (MODEO) is a ground state for program inhibition and is a relatively high voltage (e.g. 5 volts) for erase inhibition.

Referring once more to FIG. 3, since the memory cell array 4 is divided into several blocks, the row decoder 46 includes several word line drivers for selecting one or more of the memory blocks. In addition, since each of the memory blocks has a plurality of word lines, each of the word line drivers is coupled to several of the word line latches 47 for driving selected ones of the word lines in the corresponding one of the memory blocks.

Figure 13:
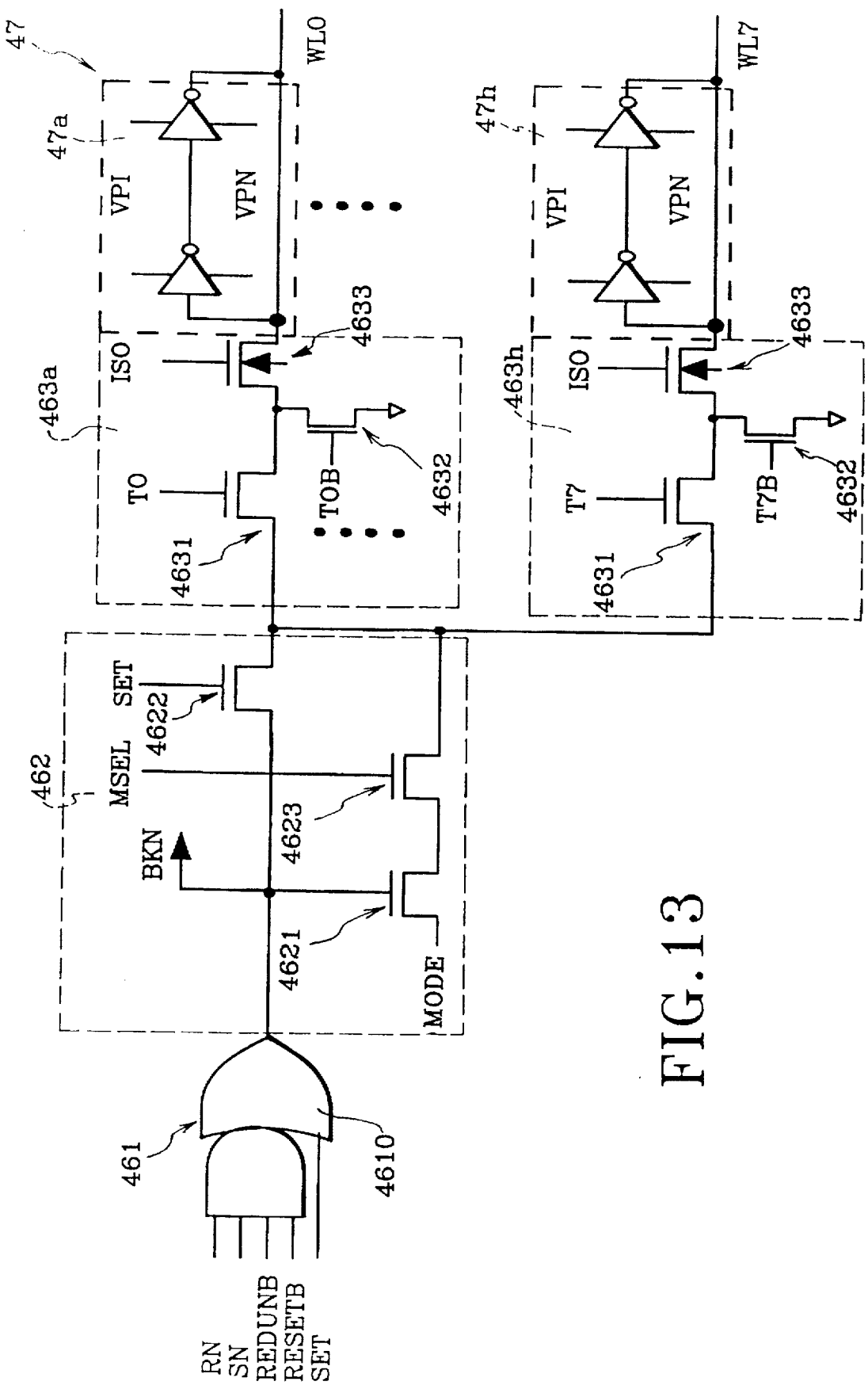
FIG. 13 illustrates one example of a word line driver for use with the first preferred embodiment.

FIG. 13 illustrates a word line driver 461 and several word line latches 47a–47h according to co-pending U.S. patent application Ser. No. 08/645,630, entitled "Flash EEPROM Word Line Decoder," and filed on May 14, 1996 by the applicant. The disclosure of the co-pending application is incorporated herein by reference. The word line driver 461 includes a pre-decoder 4610 for selecting one of the memory blocks of the memory cell array 4, a plurality of second decoders 463a–463h for selecting one of the word line latches 47a–47h, and a multiplexer 462 coupled to the pre-decoder 4610 and the second decoders 463a–463h for selecting one of the second decoders 463a–463h.

The pre-decoder 4610 receives address signals RN, SN, a REDUNB control signal, and set and reset signals SET, RESETB. The multiplexer 462 includes three transistors 4621, 4622, 4623 and receive MODE, SEL and MSEL control signals, respectively. Each of the second decoders 463a–463h includes three transistors 4631, 4632, 4633 and receive T0-T7, T0B-T7B and ISO control signals, respectively.

In the word line driver 461, if the rows of transistor cells in the associated memory block are not defective, the REDUNB control signal will be in an inactive state. The word line latches 47a–47h can be set and reset individually so that multiple word lines can be selected at the same time. Flexible size erasure is possible if the associated erase operation is an operation in which the cell threshold voltage is increased. The word line latches 47a–47h also permit application of the erase verify voltage to the selected word lines in a collective operation. Erasure is deemed to be successful when the selected transistor cells are no longer in the conducting state during the erase verify operation. High execution efficiency of the off-chip controller (not shown) can be achieved since there is no need to reload the memory address due to the word line latches 47a–47h for the rows of the memory cell array 4. In this example, a memory block consists of eight word lines. The BKN logic signal comes from the corresponding memory block. During an erase operation, the erase inhibit voltage (e.g. 0 volt) is applied to all the word lines by setting the control signals RESETB, MSEL, SEL, T0-T7, T0B-T7B, ISO to 0 volt, 0 volt, VDD, VDD, 0 volt, VDD, respectively. Then, the selected memory block is set to the VDD level via the transistors 4633 by setting the transistors 4621, 4622, 4623, 4631, 4632, 4633 to on, off, on, on, off, on, respectively. The randomly selected individual word line will be set by the same procedure, except that the transistors 4631 are decoded by the associated control signal T0-T7. After the initiation procedure, the selected word lines will be ramped to a high voltage (e.g. 15 volts), and the non-selected word lines will be kept at 0 volts or will be ramped to a relatively low voltage (e.g. 5 volts). As such, the reverse voltage between the junction N+/P-well and the P+/N-well can be reduced in the word line driver 461 to improve the device reliability.

The program operation can be achieved by initially decoding one selected word line to the logic low level and the other word lines to the logic high level after the corresponding program patterns have been latched in the read/write controller 42 (see FIG. 3). The program setup for the selected word line is described as follows: First, the logic high voltage is applied to all word lines by setting the control signals SET, MSEL, SEL, T0-T7, T0B-T7B, ISO to VDD, 0 volt, VDD, VDD, 0 volt, VDD, respectively. Next, the selected word line will be set to ground level from the line MODE by setting the transistors 4621, 4622, 4623 to on, off, on, respectively. T0B-T7B are kept at ground level throughout the program operation, and the associated T0-T7 decode the chosen word line. Once the set up procedure is completed, the selected word line will be gradually ramped to the negative high voltage. Meanwhile, the control signal ISO changes to a logic low state to isolate the voltage level between the word line driver 461 and the second stage row decoder, if any. Thus, no forward current on N+/P-well will occur for the word line driver 461 which generates the negative voltage. The transistors 4633 are turned off, and the voltage levels VPP, VPN are at 0 volt and −10 volts, respectively. Note that the voltage level VPP is switched to 0 volt whenever the voltage level VPN is pumped to a relatively low voltage (e.g. −5 volts). That way, the reverse voltage between the junction of the N+/P-well and the P+/N-well of the word line driver 461 will be reduced.

Figure 14:
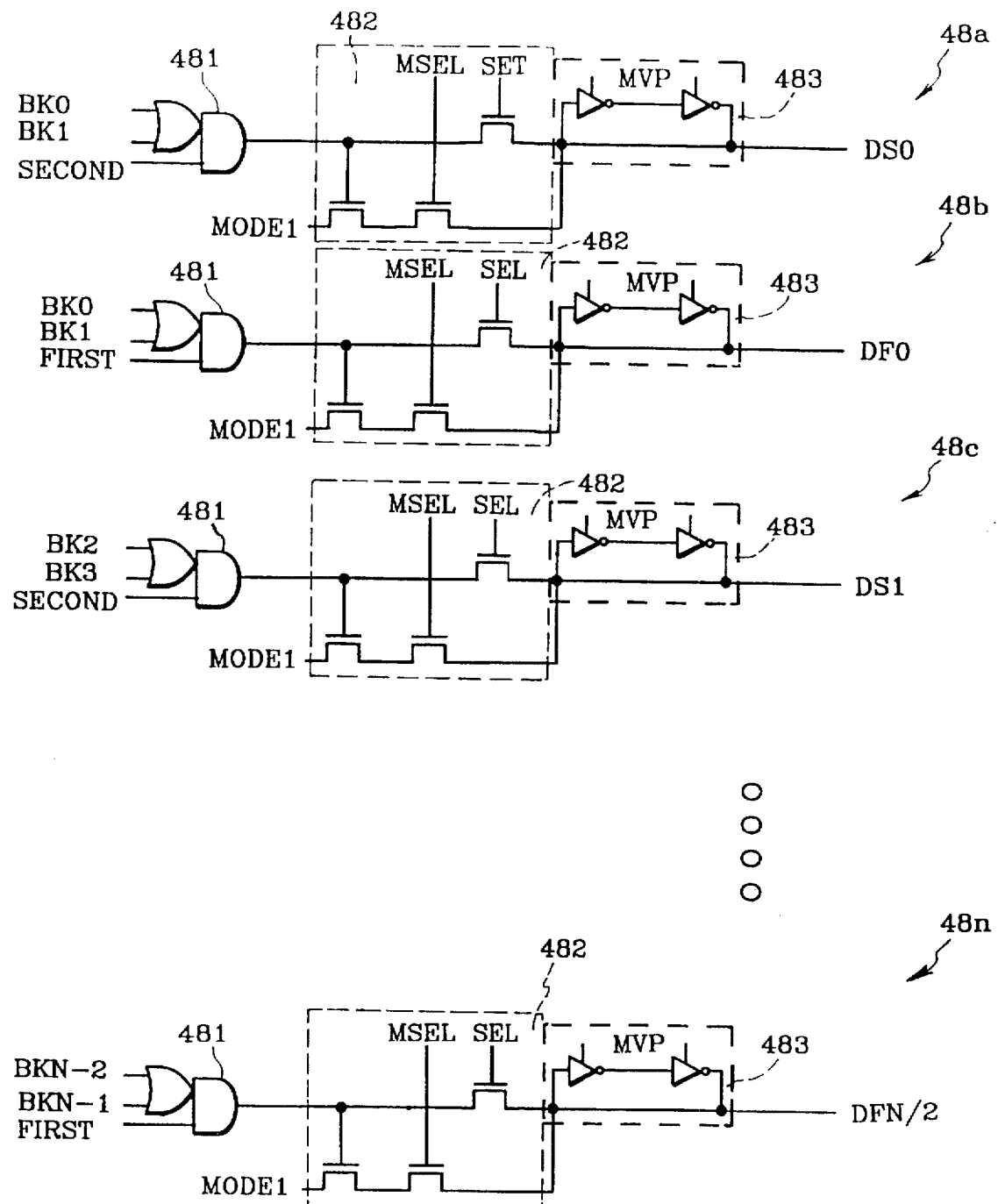
FIG. 14 illustrates drain control line drivers for the first preferred embodiment.

Referring to FIG. 14, the row decoder further includes several drain control line drivers 48a–48n. Each of the drain control drivers 48a–48n is based primarily on the word line driver 461 described beforehand and includes a decoder 481, a multiplexer 482 coupled to the decoder 481, and a latch 483 for coupling the multiplexer 482 to the OR-plane memory cell array 4 (see FIG. 3).

As mentioned beforehand, every pair of adjacent transistor cells of the memory cell array 4 in the row direction are grouped into first and second sides. For example, the control signals DF0, DS0 are dedicated to the first and second sides of a first memory block of the memory cell array 4. The control signals BK0, BK1 indicate a plurality of transistor cells in a block selected by the pre-decoder 4610 of an associated one of the word line drivers 461. Thus, every adjacent blocks of the memory cell array 4 share a drain control line driver 48a–48n that has a latch function for multiple word line erasure. During a read operation, the selected block will activate the associated drain control line driver 48a–48n. The control signals MSEL, SEL, MVP are set to 0 volt, VDD, VDD, respectively. During the program operation, the initialization procedure will set all control signals BK0 to BKN-1 to the logic high state, thereby applying the program inhibit voltage to the whole word lines. The outputs of the drain control line drivers 48a–48n may then be set selectively to the low logic state by applying the control signals FIRST, SECOND to logic low.

Whenever the selected word line is set to logic low, the associated drain control line driver 48a–48n will be set to the logic high state. The control signals MSEL, SEL, MVP, MODE1 are set to VDD, 0 volt, VDD, VDD, respectively, at this time. At the same time, the appropriate drain control line driver 48a–48n will gradually ramp to the medium high voltage (e.g. 7 volts) to transfer the main bit line voltage to the selected sub-bit line.

During a non-flash type erase operation, the initialization procedure will set all control signals BK0 to BKN-1 to the logic low state, thereby applying the erase inhibit voltage to the whole word lines. The outputs of the drain control line drivers 48a–48n may then be set selectively to the low logic state by applying the control signals FIRST, SECOND to logic low. The control signals MSEL, SEL, MVP are set to 0 volt, VDD, VDD, respectively.

Whenever the selected word line is set to logic high, the associated drain control line driver 48a–48n will also be set to the logic high state. The control signals MSEL, SEL, MVP, MODE1 are set to VDD, 0 volt, VDD, VDD, respectively, at this time. At the same time, the appropriate drain control line driver 48a–48n will gradually ramp to the medium high voltage (e.g. 7 volts) to transfer the main bit line voltage to the selected sub-bit line. MVP, which is the positive power supply of the latch 483, can ramp from VDD to 7 volts. During a flash-type erase operation, the signals FIRST, SECOND are both set to logic high to pass the erase enable voltage to the selected sub-bit lines.

Figure 15:
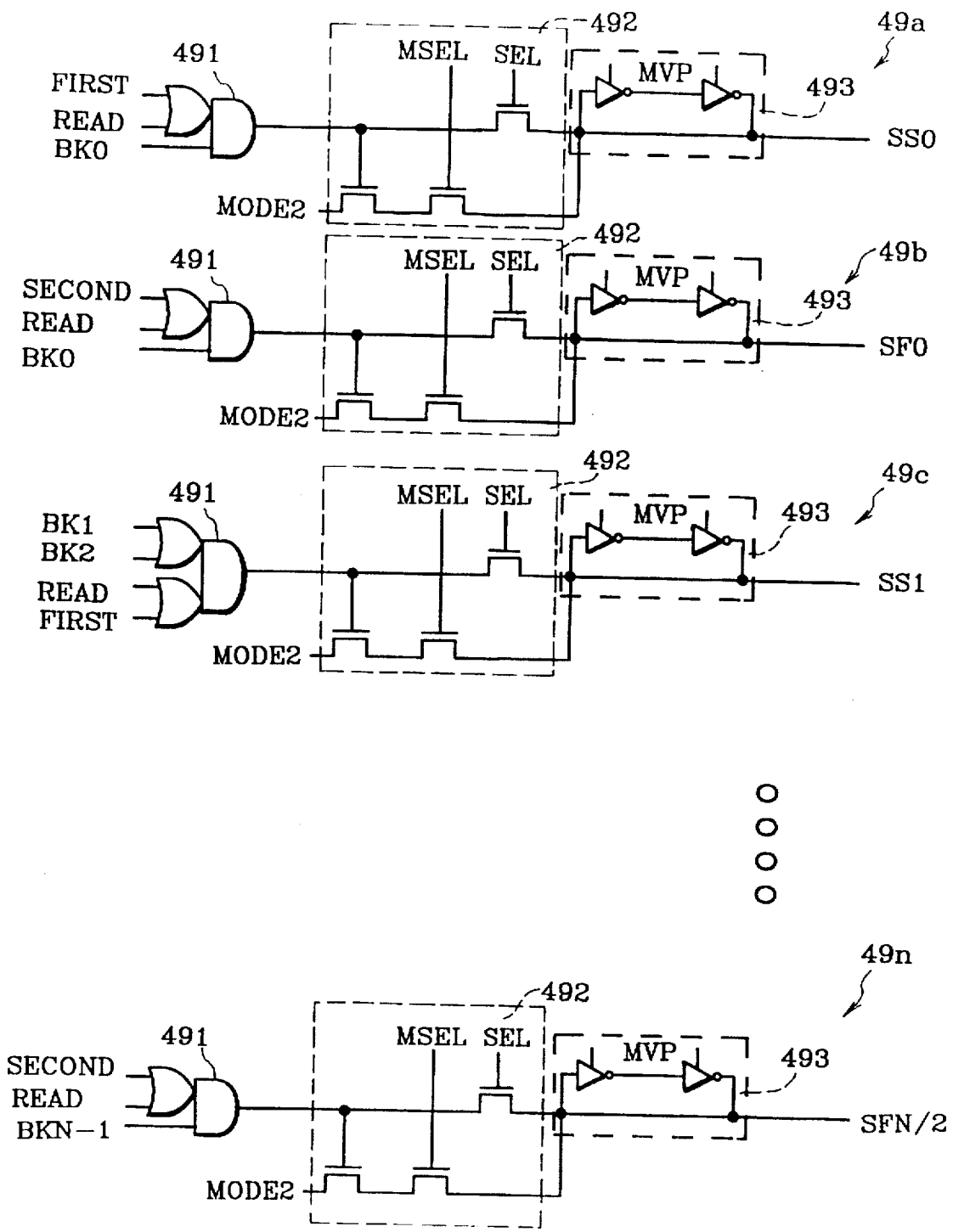
FIG. 15 illustrates source control line drivers for the first preferred embodiment.

Referring to FIG. 15, the row decoder further includes several source control line drivers 49a–49n. The source control line drivers 49a–49n are substantially similar to the drain control drivers 48a–48n and also include a decoder 491, a multiplexer 492 coupled to the decoder 491, and a latch 493 for coupling the multiplexer 492 to the OR-plane memory cell array 4 (see FIG. 3).

Except for blocks 0 and N-1 of the memory cell array 4, every two adjacent memory blocks of the memory cell array 4 share a source control line driver 49a–49n. All source line control drivers 49a–49n are activated by the READ signal during a read operation. During a program operation, the initialization procedure will set all control signals BK0 to BKN-1 to the logic high state. However, since the control signals FIRST, SECOND, SEL, MSEL, MODE2 are set to 0 volt, 0 volt, VDD, 0 volt, 0 volt, respectively, the outputs of the selected source control line drivers 49a–49n may be set to the low logic state. After initialization, if the first side cell in block 0 is selected, the control signals FIRST, SECOND, SEL, MSEL, MODE2, BK0 are set to VDD, 0 volt, 0 volt, VDD, VDD, VDD, respectively. Thus, the source of the selected transistor cell will be floating while the program inhibit voltage will be applied to the sources of the non-selected transistor cells at the second side of block 0.

During a non-flash type erase operation, the initialization procedure will set all control signals BK0 to BKN-1 to the logic low state, thereby applying the erase inhibit voltage to the whole word lines. The outputs of the source control line drivers 49a–49n may then be set selectively to the low logic state by applying the control signals FIRST, SECOND to the low logic state. After initialization, if the second side cell in block 0 is selected, the control signals FIRST, SECOND, SEL, MSEL, MODE2, BK0 are set to 0 volt, VDD, 0 volt, VDD, VDD, VDD, respectively. Thus, whenever the selected word line is set to logic high, the associated source control line driver 49a–49n will be set to the logic low state.

Meanwhile, the source of the adjacent first side cell is applied with the erase inhibit voltage by activating the corresponding source control line driver 49a–49n. Once set, the non-selected source control line drivers 49a–49n will gradually ramp to the medium high voltage (e.g. 7 volts) to transfer the main source line voltage to the appropriate sub-source line for erase inhibition. During a flash-type erase operation, the signals FIRST, SECOND are both set to logic high to pass the erase enable voltage to the selected sub-bit lines. The control signal MODE2 is applied to ground level to disable all the source control line drivers 49a–49n.

Table III summarizes the bias conditions for the block 0 control line drivers 48a, 49a during the read and program operations:

TABLE III

| Signal | Read First Side Cell | Program Initialization | Program First Side Cell |
|---|---|---|---|
| FIRST | VDD | 0 V | VDD |
| SECOND | 0 V | 0 V | 0 V |
| MODE1 | X | X | VDD |
| MODE2 | X | X | VDD |
| SEL | VDD | VDD | 0 V |
| MSEL | 0 V | 0 V | VDD |
| READ | VDD | 0 V | 0 V |

Table IV summarizes the bias conditions for the block 0 control line drivers 48a, 49a during the erase operations:

TABLE IV

| Signal | Erase Initialization | Erase Second Side Cell (Non-Flash) | Erase Cell (Flash) |
|---|---|---|---|
| FIRST | 0 V | 0 V | VDD |
| SECOND | 0 V | VDD | VDD |
| MODE1 | X | VDD | VDD |
| MODE2 | X | VDD | 0 V |
| SEL | VDD | 0 V | 0 V |
| MSEL | 0 V | VDD | VDD |
| READ | 0 V | 0 V | 0 V |

Figure 16:
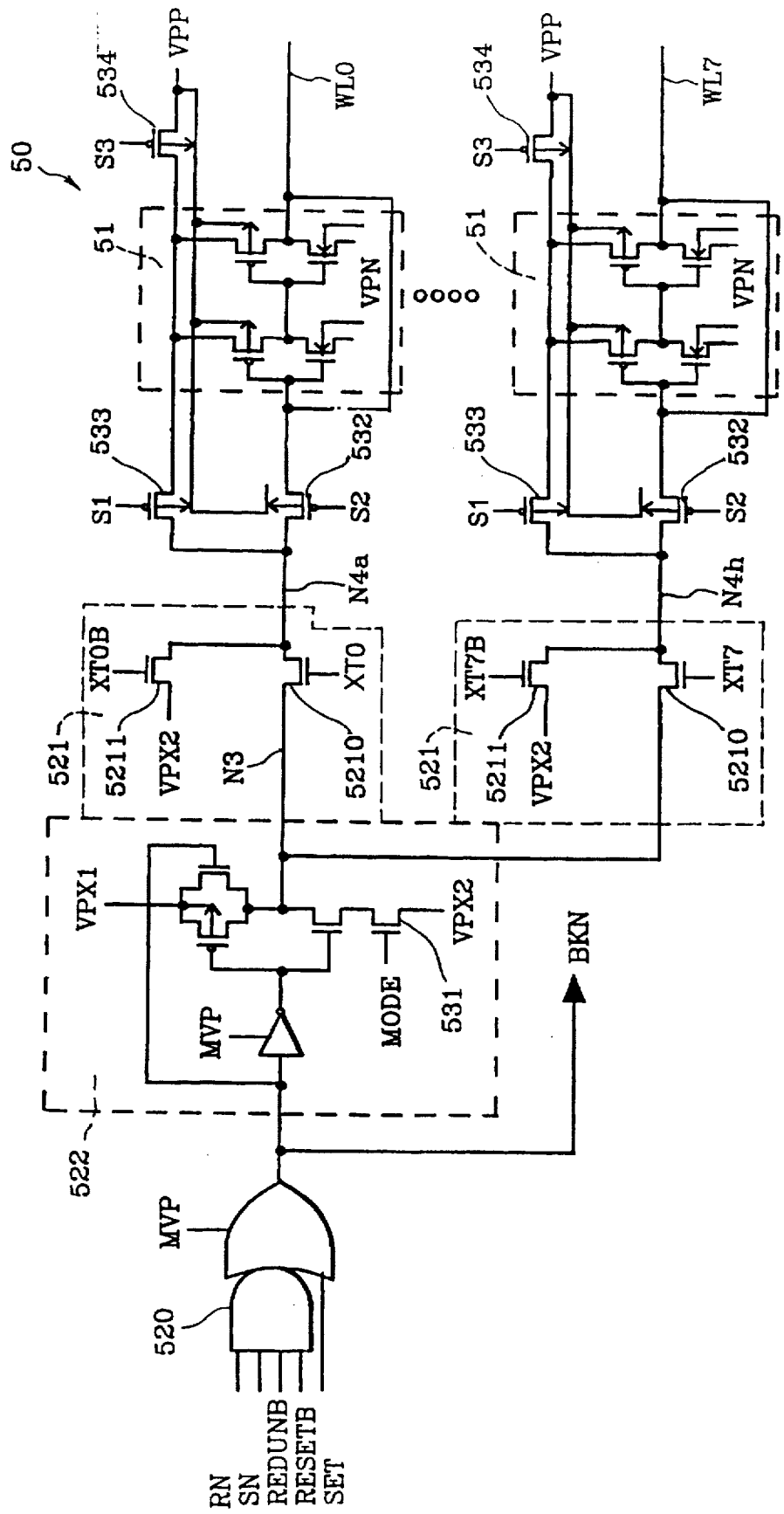
FIG. 16 illustrates a modified word line driver for use with the first preferred embodiment.

FIG. 16 illustrates another word line driver 50 according to the co-pending U.S. patent application Ser. No. 08/676, 066, entitled "Flash Memory Word Line Decoder With Over-Erase Repair." The word line driver 50 is designated for use in negative high voltage erasure of the OR-plane memory cell array 4. The word line driver 50 includes eight rows WL0–WL7 corresponding to one memory block of the memory cell array 4. Each row has a latch 51 coupled to a respective second stage 521 of the X-decoder that is controlled by a plurality of signals XT0-XT0 and XT0B-XT07 from an X-pre-decoder (not shown). A common line N3 is connected to the signal VPX1 or VPX2, or floats according to the multiplexing action due to the signal MODE and the output from the first stage 520 of the X-decoder 52. Since the input signals RN, SN, REDUNB, RESETB, SET, VPX1 and VPX2 are applied to the first stage 520 of the X-decoder, each word line can be latched to a specific operating voltage corresponding to different predetermined situations. The three major operations of the flash memory, i.e. read, program and erase, are all correlated to the word line driver 50 and are described briefly in the following paragraphs:

1. When reading selected transistor cells, the input signals RESETB and SET will be in an inactive state. If the rows in the selected memory block are not defective, the REDUNB signal will also be in an inactive state. The signals RN and SN are from another X-pre-decoder (not shown). As such, the decoded block address can be sent to the line N3. The signal MODE always keeps the transistor 531 transparent, which permits passage of the ground level VPX2 signal during the read operation. At the same time, the VPX1 signal is kept at the VDD level so that further decoding stages will be performed in accordance with the addresses XT0-XT7 and XT0B-XT7B from the X-pre-decoder. The further decoding stages will permit the transfer of the voltage at line N3 to one of the lines N4a–N4h. Then, one of the word lines will get the decoded voltage level through a respective transistor 532 that is controlled by the signal S2, which is always kept at the ground level during the read operation. The positive power signal VPP to the latches 51 is controlled by a multiplexer via transistors 533, 534 that are operated by control signals S1, S3. The signal S1 is at VDD level while the signal S3 is at ground level during the read operation.

To better understand the read operation, one example is described as follows. The word line driver 50 of a selected block will be provided with a VDD level at the line N3 while the word line drivers 50 of non-selected blocks will be provided with the ground level at the same line. If the selected row is WL0, the selected row will be pulled to the VDD level by the VPX1 signal, while the non-selected rows will be pulled down to the ground level which passes through the transistors 531, 5211.

2. The program operation is done in the same manner as the non-flash type erase operation mentioned beforehand, that is, using the positive high voltage on the selected word line. First, initialization of the word line driver 50 sets the signals RESETB, SET, REDUNB, VPX1, VPX2, MODE, XT0-XT7, XT0B-XT7B, S1, S2, S3, VPP to 0 volt, VDD, VDD, VDD, 0 volt, 0 volt, VDD, 0 volt, VDD, 0 volt, VDD, respectively. After initialization, the VPP signal, which is the positive power supply of the latches 51, will be gradually ramped to a high voltage (e.g. 15 volts). The latched voltage level of the word line is also increased by shutting off the transistors 532, 533. The written data pattern is stored in the read/write controller 42 (see FIG. 3) which applies the appropriate voltage to the bit lines. Due to the high electric field between the control gate and the channel formed from the drain side to the source side, the negative charge will be injected into the floating gate. Therefore, collective programming (increased threshold voltage) of transistor cells can be achieved by using the F-N tunneling scheme. Also, the program-inhibited transistor cells keep their original threshold voltage because the electric field is reduced by the higher bit line voltage.

3. In this embodiment, the negative high gate voltage erasure uses F-N tunneling to eject the negative charges stored in the floating gate. Thus, such non-flash type erasure is performed in the same manner as the above mentioned program operation which uses the negative high voltage on the selected word line. By utilizing precise iteration during verification, there is no over-erase issue. However, the flash-type erasure carries the possibility of over-erasure. To avoid this problem, the word line driver 50 is capable of supplying three different kinds of voltages during the erase verify, over-erase verify and over-erase repair operations. Misidentification of insufficiently erased transistor cells as erased cells is due to large currents caused by over-erased cells which are not shut off during verification. The prior art minimizes the presence of over-erased transistor cells by pre-programming. In this invention, non-selected over-erased cells can be shut off during erase and over-erase verification procedures.

During a flash erase operation, the first step is to initialize all rows to the erase inhibit state. The erase inhibit level can be set by applying the signals SET and XT0-XT7 to the logic high state, and by applying the signals XT0B-XT7B to the logic low state. Meanwhile, the transistors 532, 533, 534, are respectively in the on, off, on states, while the signals MVP, VPX1, VPP are all at the VDD level. The signal VPX1 is changed to the ground level throughout the erase operation after finishing the erase set up stage. Therefore, the logic low level passes through the multiplexer 522 to the line N3 and to a selected one of the lines N4a–N4h. This way, the previous erase inhibit voltage on the selected word line can be flipped to the erase enable voltage. If the selected block is to be erased, the signals XT0-XT7, MODE, VPX1 may be set to VDD, 0 volt, 0 volt, respectively, to facilitate the erasure procedure since erasing need not be done row by row. Once the set up procedure is completed, the transistors 532, 533, 534 are respectively in the off, off, on states, and the signals VPP, VPN are at 0 volt, -10 volts, respectively, to commence erasure. Note that the signal VPP is switched to 0 volt whenever the signal VPN is pumped to a relatively low voltage (e.g. -5 volts). In this way, the reverse voltage between the junction of the N+/P-well and the P+/N-well will be reduced.

With respect to chip erase, the RESETB signal is initialized for all rows. To enable the second stage 521 of the X-decoder, the signals XT0-XT7, XT0B-XT7B are set to VDD, 0 volt respectively. The first stage 520 of the X-decoder is also reset to the low logic level by the RESETB signal, thereby activating the multiplexer 522 to make the signal VPX1 transparent through the line N3 so as to generate the erase enable signal for chip erase.

As mentioned beforehand, the word line driver 50 is capable of supplying three different kinds of voltages during the erase verify, over-erase verify and over-erase repair operations. The three voltages prevent non-erased cells on the same bit line from being incorrectly identified as erased cells, and permit latching of the original erase patterns in the word lines, except for the cells of the selected word line to be verified or repaired. For the non-selected word lines, verification and repair of the selected word lines will not affect the latched logic level thereat. The three voltage levels are applied to the selected, non-erased and non-selected but erased word lines, respectively. For the selected word lines, the voltage level that is applied is a low voltage (e.g. 1 volt) for erase verification, a low voltage (e.g. 0.5 volt) for over-erase verification, and an adjustable high voltage (e.g. 5–15 volts) for over-erase repair in which only one word line is selected by scanning. For the non-erased word lines, 0 volt is applied to shut off all the cells thereat. For the non-selected but erased word lines, a negative voltage (-LV, e.g. -5 to -2 volts), which is dependent on the minimum threshold voltage of the over-erased cells, is applied.

Referring again to FIG. 16, a scanning operation is conducted to check the state of each of the word lines by reading out the latched value through the multiplexer 522 to the signal VPX1. At this time, the transistors 532, 533, 534 are respectively at the on, off, on states, and the signals VPP, VPN are at VDD, 0 volt, respectively. If the voltage levels of the word lines WL0–WL7 are 0 volt, VDD, 0 volt, VDD, VDD, VDD, VDD, VDD, respectively, then the first scanned erase word line is WL0. The word line WL0 is then reset to VDD, and all the word lines are then discharged to –LV (for 0 volt word lines) and 0 volt (for VDD word lines), except for the word line WL0. At this time, the transistors 531, 532, 533, 534 are on, off, on, off, respectively. The transistors 5210, 5211 associated with the word line WL0 are on, off, respectively, while the transistors 5210, 5211 associated with the other word lines WL1–WL7 are off, on, respectively. As such, the signal VPX1, which serves as the verify and repair voltage, can pass through the multiplexer 522 as necessary for reception by the word line WL0. Two kinds of voltages (e.g. 0.5 volt, 1 volt) are available to the word line WL0 for over-erase verify and erase verify. During the verification mode, the non-erased word lines are kept at 0 volt, while the non-selected but erased word lines are kept at the negative voltage (–LV). The signals VPX1, MVP, XT0–XT7, XT0B–XT7B can be pumped up when there is a requirement for efficiency in repairing the over-erased transistor cells. This capability is made possible by the presence of a level shifter in the first stage of the X-decoder. The present invention provides the feature of shutting off the non-selected over-erased cells during erase verification and over-erase verification.

Figure 17:
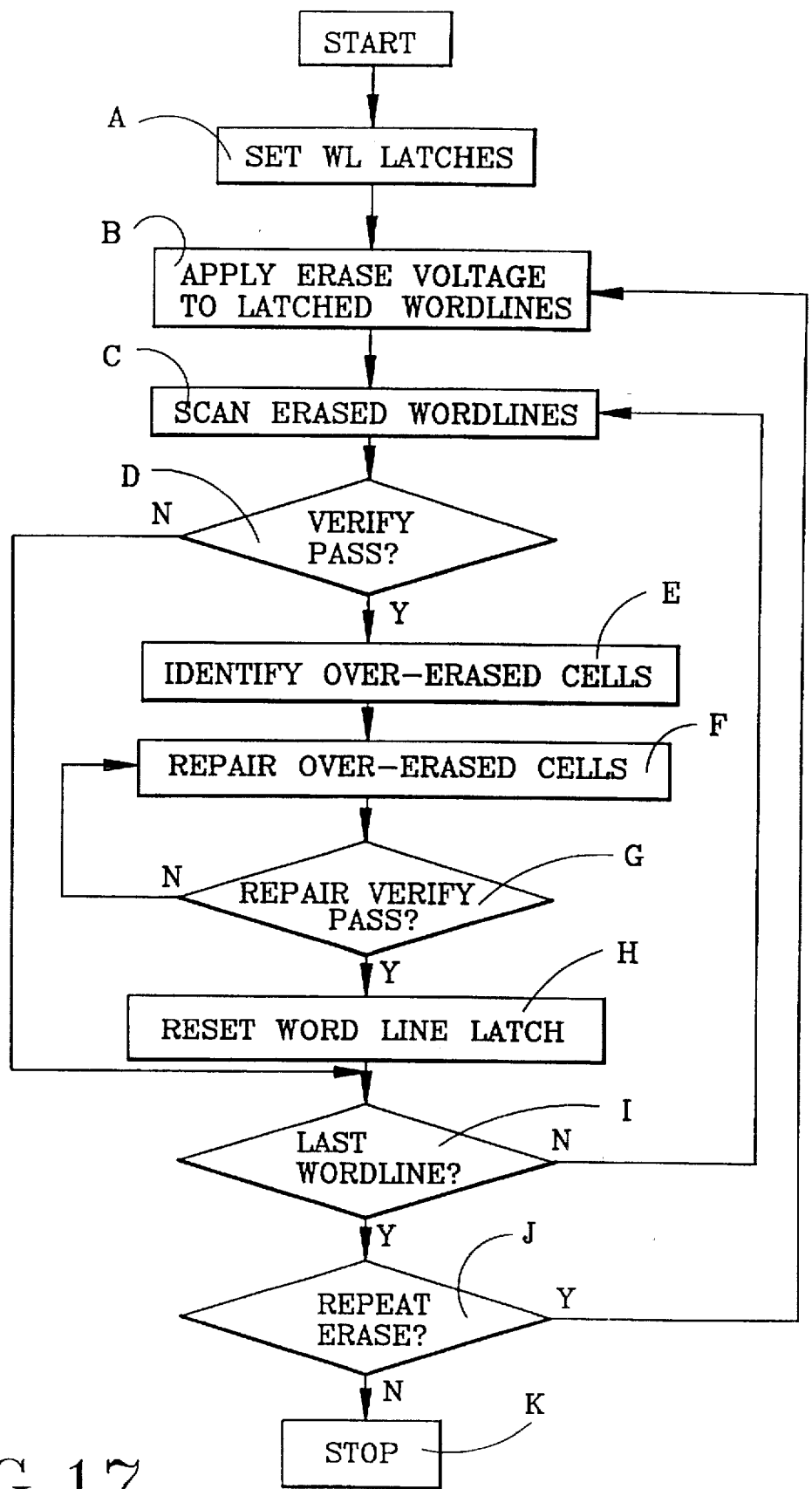
FIG. 17 illustrates a flowchart of the-erasing method of this invention.

FIG. 17 illustrates a flowchart for the negative gate voltage erasure operation of this invention, a detailed description of which can also be found in the co-pending U.S. patent application Ser. No. 08/676,066, entitled "Flash Memory word Line Decoder With-Over-Erase Repair." Block A is an erase setup block which is encountered upon reception of a command from the off-chip controller and the row address that is to be erased. At this time, the erase inhibit voltage is applied to the entire memory cell array, and the erase pattern is then sent to the selected memory block one by one. After the block erase pattern has been set up, the erase pattern for the selected row will be set up one by one. Once all of the erase patterns have been latched in each of the selected blocks and rows, block B, which is an erase block; is encountered in which the selected word lines are pumped to a negative high level (e.g. –10 volts) and in which the bit line voltages are pumped to a relatively high voltage (e.g. 5 volts). Block C, which is a scanning block, is then encountered. Scanning is necessary since the addresses of multiple-selected word lines are randomly distributed. Thus, the erased word lines (e.g. word line is at a logic low level) can be found without storing the address in registers, or reloading the address with the use of the off-chip controller. The state of each word line can be read out by a sequencer (not shown). Whenever the state of the scanned word line is at the logic high level, the sequencer will skip to the next word line. Once the state of the scanned word line is found to be at the logic low level, block D, which is an erase verify block, is encountered. If the threshold voltages of all of the transistor cells on the scanned word line are lower than the erase verify voltage (e.g. 1 volt), block E, which is an over-erase verify block, is encountered. Otherwise, it is tested if the scanned word line is the last erased word line (block I), and the scanned word line is kept at the low state during subsequent erase operations.

In block E, if the threshold voltage of any of the transistor cells was found to be lower than the over-erase verify voltage (e.g. 0.5 volt), block F, which is an over-erase repair block, is encountered. At this time, the over-erase repair voltage is applied to the detected ones of the transistor cells. After block F, block G, which is a repair verification block, is performed to check if the over-erased cells have been repaired. If over-erased cells are still present, that is, the threshold voltages of some of the transistor cells remain lower than the repair verify voltage (e.g. 0.5 volt), the repair block is performed once again. Repeated execution of the repair block may be done until a predetermined count is reached, indicative of the fact that the transistor cells are beyond repair. The erase operation may be terminated at this time.

In block G, if the over-erased cells have been repaired, block H is encountered where the selected word line will be flipped to the logic high level. Block I is then performed. If the scanned word line is not the last erased word line, the operation goes back to block C to search for the next word line to be verified. Otherwise, block J is encountered to determine whether the erase operation is to be repeated. The erase operation is terminated in block K when all of the word lines are at the logic high level. If any of the word lines is still in the logic low level, meaning that some transistor cells have yet to be erased, the erase operation is repeated by executing block B.

The drain and source control line drivers to be used with the word line driver 50 of FIG. 16 are similar to those shown in FIGS. 14 and 15. The bias conditions for the read, program and non-flash and flash-type erase operations of the drain and source control line drivers can be found in Tables III and IV.

Figure 18:
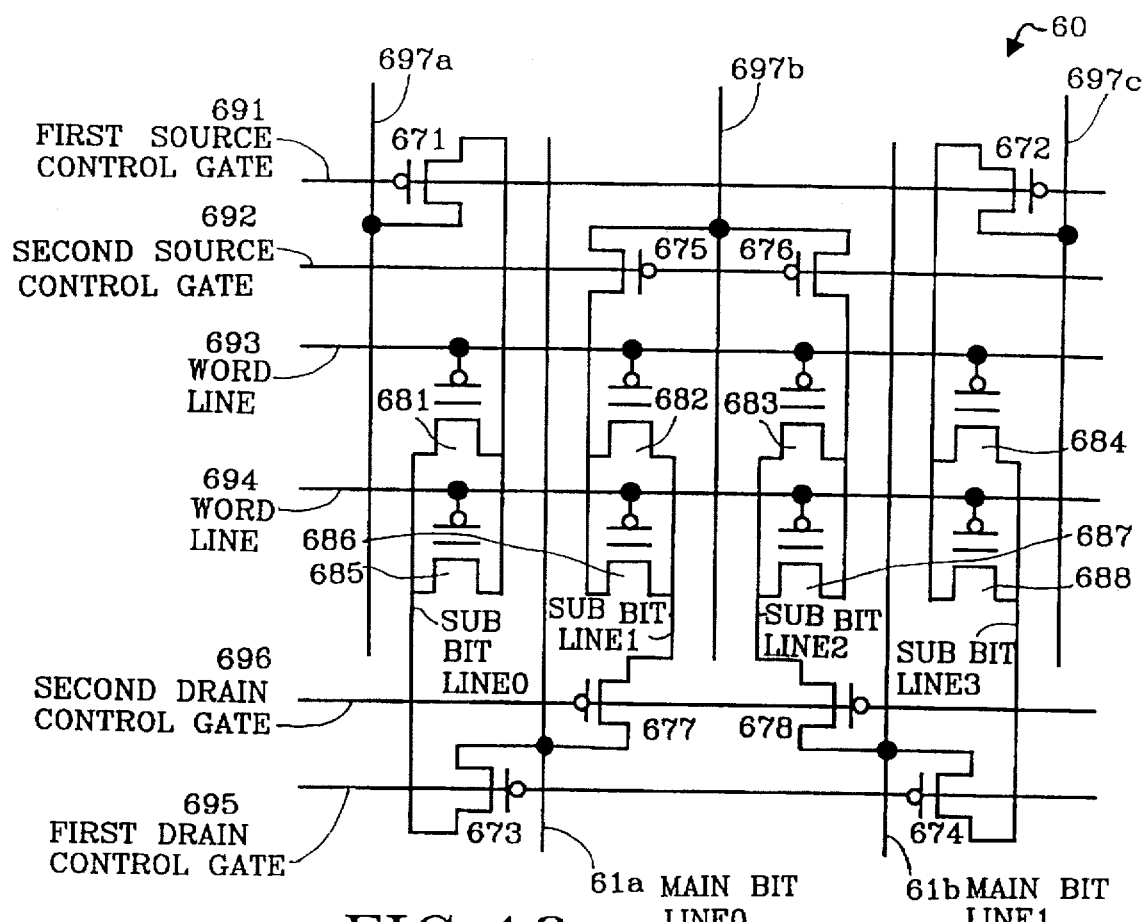
FIG. 18 illustrates a basic circuit of the second preferred embodiment of the OR-plane memory cell array according to this invention.

FIG. 18 is a schematic electrical circuit diagram of a basic circuit 60 of the second preferred embodiment of an OR-plane memory cell array according to this invention. As shown, the basic circuit 60 also includes two rows and four columns of transistor cells 681–688, a first source control gate pair 671, 672, a first drain control gate pair 673, 674, a second source control gate pair 675, 676, and a second drain control gate pair 677, 6780. The transistor cells 681–688 in the same row have gate terminals which are coupled to a respective one of first and second word lines 693, 694. The transistor cells 681–688 in the same column have source terminals coupled to one of first to fourth sub-source lines, and drain terminals coupled to one of first to fourth sub-bit lines. The first source control gates 671, 672 have gate terminals coupled to a first source control line 691, drain terminals connected to a respective one of the first and fourth sub-source lines, and source terminals connected to a respective one of first and third main source lines 697a, 697c. The second source control gates 675, 676 have gate terminals coupled to a second source control line 692, drain terminals connected to a respective one of the second and third sub-source lines, and source terminals connected to a second main source line 697b. The first drain control gates 673, 674 have gate terminals coupled to a first drain control line 695, drain terminals connected to a respective one of the first and fourth sub-bit lines, and source terminals connected to a respective one of first and second main bit line 61a, 61b. The second drain control gates 677, 678 have gate terminals coupled to a second drain control line 696, drain terminals connected to a respective one of the second and third sub-bit lines, and source terminals connected to a respective one of the first and second main bit lines 61a, 61b.

Figure 19:
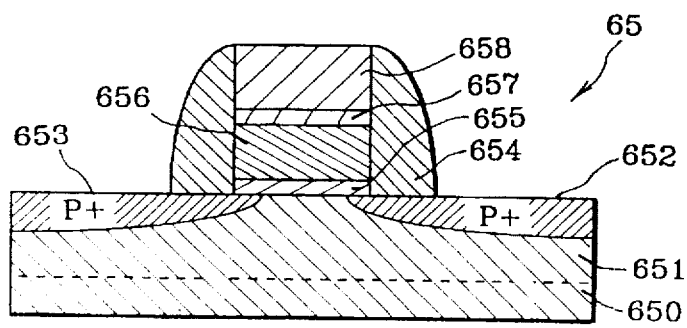
FIG. 19 is a cross-sectional view of a P-channel memory cell of the second preferred embodiment.

FIG. 19 is a cross-sectional view of a P-channel memory cell 65 used in the basic circuit 60. The memory cell 65 includes a P-type substrate 650, an N-type well 651 formed in the P-type substrate 650, a P-type diffusion layer 652 which constitutes the drain region, a P-type diffusion layer 653 which constitutes the source region, an insulator 654, a tunnel oxide layer 655, a floating gate 656 on the tunnel oxide layer 655, an insulating layer 657 formed by nitride-oxide-nitride and disposed on the floating gate 656, and a control gate 658 on the insulating layer 657.

Use of the P-channel memory cell 65 as a storing medium results in the elimination of hot hole injection into the tunneling oxide. Due to the positively biased control gate, the electric field in the tunnel oxide keeps the hot holes from being injected. Therefore, the tunnel oxide is free of degradation unlike the case of edge F-N tunneling for the N-channel memory cell. If N-channel memory cells are in use, the setting sequence of decreasing the threshold voltage before increasing the same will eventually expel the hot holes in the tunnel oxide.

Referring again to FIG. 18, note that the transistor cells in the column direction have sub-source and sub-bit lines which are not shared with the transistor cells in the adjacent columns. By means of the source control gates 671, 672, 675, 676, each sub-source line can be connected to one of the main source lines 697a, 697b, 697c. Due to the separate source and drain, the threshold voltage of a transistor cell can be easily programmed to a lower level without affecting the transistor cells in the adjacent columns.

During programming, a negative drain voltage and a positive gate voltage are applied to the selected transistor cell. Thus, electron-hole pairs are generated by the strong electric field between the drain and gate regions, and the electrons are accelerated by a lateral electric field toward the channel region. Some of the electrons obtain high energy for injection into the floating gate through the tunnel oxide. On the contrary, during erasing, a negative gate voltage and a positive drain voltage are applied to the transistor cell. Thus, ejection of electrons from the floating gate to the channel region can be achieved. Because both the erase and program operations can be bit-selective, increasing or decreasing the threshold voltage of a transistor cell can be deemed to be the erase or program operation. Over-erasing is not an issue when erasure is performed by increasing the cell threshold voltage.

Table V summarizes the bias conditions for the basic circuit 60 during read, erase and program operations when the erase operation is defined as an operation in which the threshold voltage of a transistor cell is increased, while the program operation is defined as an operation in which the threshold voltage is decreased:

TABLE V

| Lead | Serial Reading Cell 681 | Random Reading Cell 686 | Bit Erase Cell 687 | Flash Erase Cells 681 to 684 | Program Cell 688 |
|---|---|---|---|---|---|
| N-well | VDD | VDD | 0 V | 0 V | 0 V |
| 691 | 0 V | 0 V | -MV | 0 V | 0 V |
| 692 | 0 V | 0 V | 0 V | 0 V | -MV |
| 693 | 0 V | VDD | -MV | -NV | 0 V |
| 694 | VDD | 0 V | -NV | -MV | HV |
| 695 | 0 V | VDD | 0 V | -MV | -MV |
| 696 | VDD | 0 V | -MV | -MV | 0 V |
| 61a | Vs | Vs | -MV | 0 V | 0 V |
| 61b | VDD | VDD | 0 V | 0 V | -MV |
| 697a–697c | VDD | VDD | -MV | 0 V | 0 V | where:

HV=High Voltage (10 volts)

−MV=Negative Medium Voltage (−5 to −8 volts)

Vs=Bit Line Sense Voltage (1.2 volts)

−NV=Negative Voltage (−12 to 15 volts)

Table VI summarizes the bias conditions for the basic circuit 60 during the read, erase and program operations when the erase operation is defined as an operation in which the threshold voltage is decreased, while the program operation is defined as an operation in which the threshold voltage is increased:

TABLE VI

| Lead | Serial Reading Cell 681 | Random Reading Cell 686 | Bit Erase Cell 687 | Flash Erase Cells 681 to 684 | Program Cell 688 |
|---|---|---|---|---|---|
| N-well | VDD | VDD | 0 V | 0 V | 0 V |
| 691 | 0 V | 0 V | -MV | 0 V | 0 V |
| 692 | 0 V | 0 V | 0 V | 0 V | -MV |
| 693 | 0 V | VDD | 0 V | HV | -MV |
| 694 | VDD | 0 V | HV | 0 V | -NV |
| 695 | 0 V | VDD | 0 V | -MV | -MV |
| 696 | VDD | 0 V | -MV | -MV | 0 V |
| 61a | Vs | Vs | 0 V | -MV | -MV |
| 61b | VDD | VDD | -MV | -MV | 0 V |
| 697a–697c | VDD | VDD | 0 V | 0 V | -MV |

Figure 20:
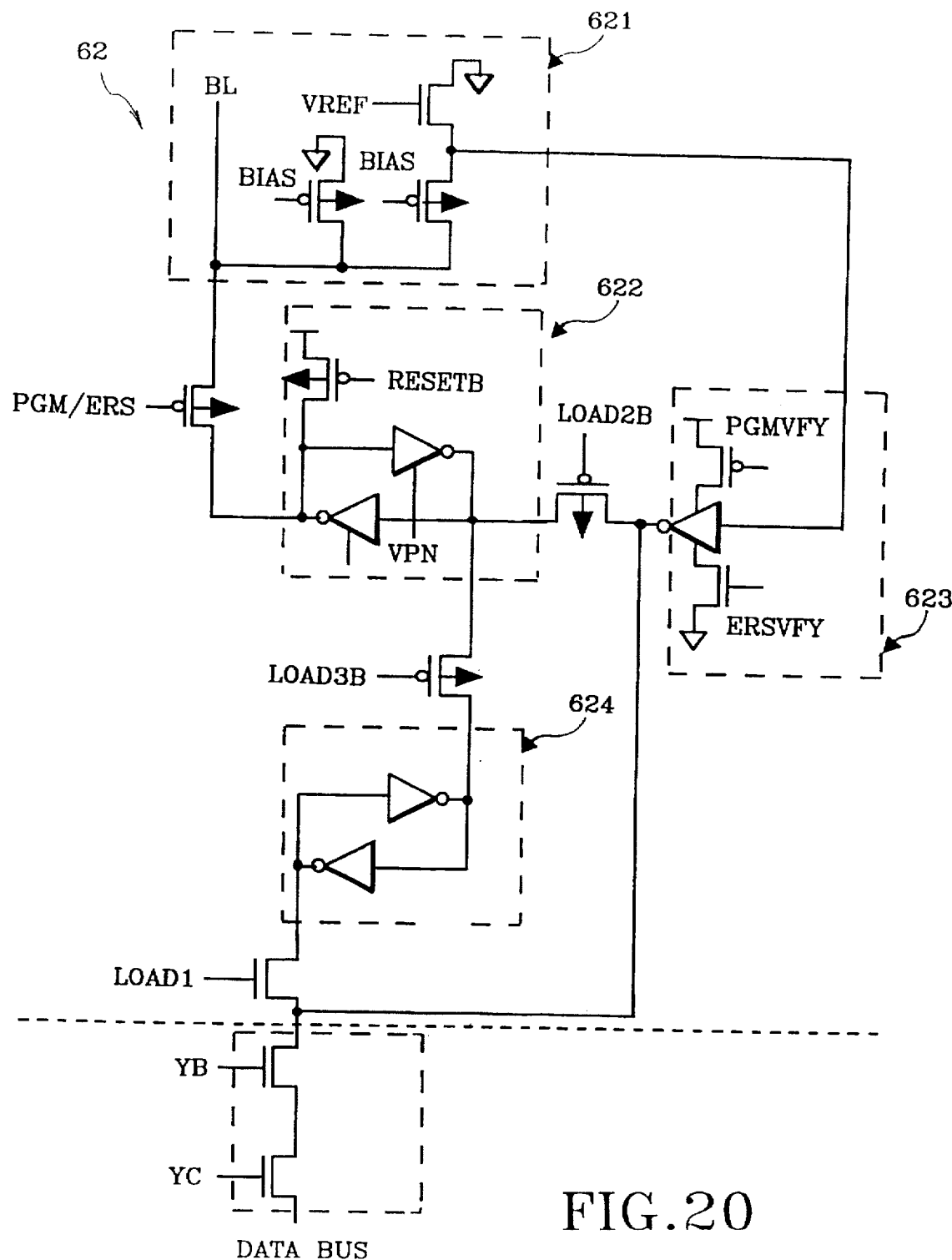
FIG. 20 illustrates a read/write controller for the second preferred embodiment.

FIG. 20 illustrates a read/write controller 62 for basic circuit 60 of FIG. 18. As shown, the read/write controller 62 is substantially similar to the read/write controller 42 of FIG. 9 and includes a single-ended sense amplifier 621, a slave latch 622, a comparator 623 and a master latch 624. The master latch 624 is used to store a new data pattern. The sense amplifier 621 is used to read the original data of a corresponding transistor cell. The data comparator 623 is used to compare the original data with the new data pattern and generates an erase/program pattern. The slave latch 622 is used to store the erase/program pattern for subsequent operations.

Figure 21:
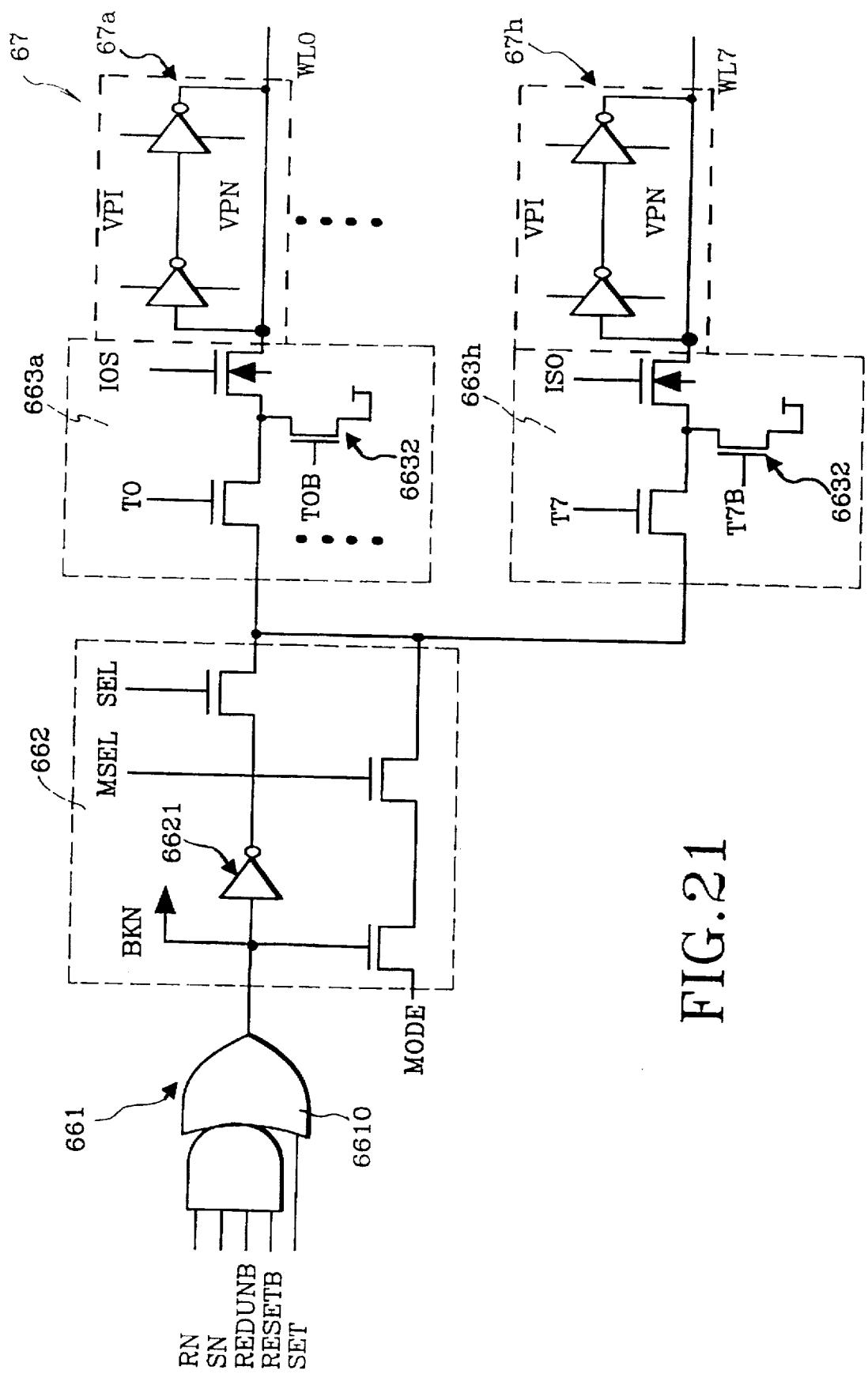
FIG. 21 illustrates a word line driver for use with the second preferred embodiment.

FIG. 21 illustrates a word line driver 661 and several word line latches 67a–67h for use with the basic circuit 60 of FIG. 18. As shown, the word line driver 661 is substantially similar to the word line driver 461 shown in FIG. 13 and includes a pre-decoder 6610, a plurality of second decoders 663a–663h for selecting one of the word line latches 67a–67h, and a multiplexer 662 coupled to the pre-decoder 6610 and the second decoders 663a–663h for selecting one of the second decoders 663a–663h. The main differences between the word line driver 661 and that shown in FIG. 13 reside in the additional inverter 6621 in the multiplexer 662, and in the pull-up connection for the transistor 6632 in each of the second decoders 663a–663h. The word line driver 661 is suitable for applications where over-erase is not an issue, i.e. the erase operation is performed as increasing the cell threshold voltage.

Figure 22:
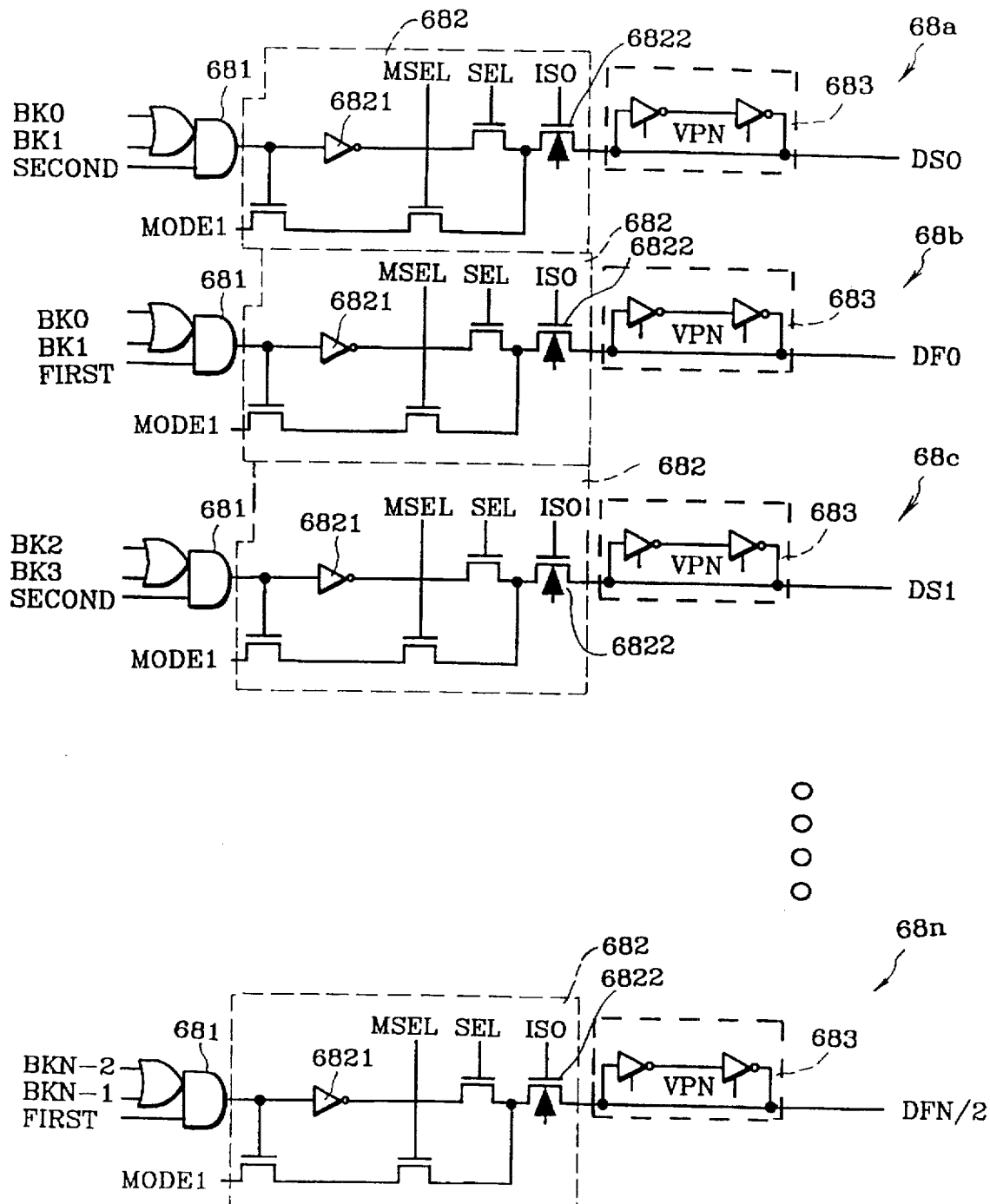
FIG. 22 illustrates drain control line drivers for the second preferred embodiment.

FIG. 22 illustrates drain control line drivers 68a–68n for use with the basic circuit 60 of FIG. 18. The drain control line drivers 68a–68n are substantially similar to the drain control line drivers 48a–48n shown in FIG. 14 and respectively include a decoder 681, a multiplexer 682 coupled to the decoder 681, and a latch 683 for coupling the multiplexer 682 to the OR-plane memory cell array. The main differences between the drain line control drivers 68a–68n and those shown in FIG. 14 reside in the additional inverter 6821 and N-type pass gate 6822 in the multiplexer 682, and the power supply VPN for the latch 683. Due to the complementary logic between N-channel and P-channel transistor cells, the inverter 6821 sets the selected drain line control driver 68a–68n to the logic low state. The signal ISO is used to isolate the voltage level between the associated word line driver and the second stage of the X-decoder. Thus, the pass gate 6822 can be turned off during an erasing or programming operation to prevent forward currents on the N+/P-well of the word line driver that is generating the negative voltage.

Figure 23:
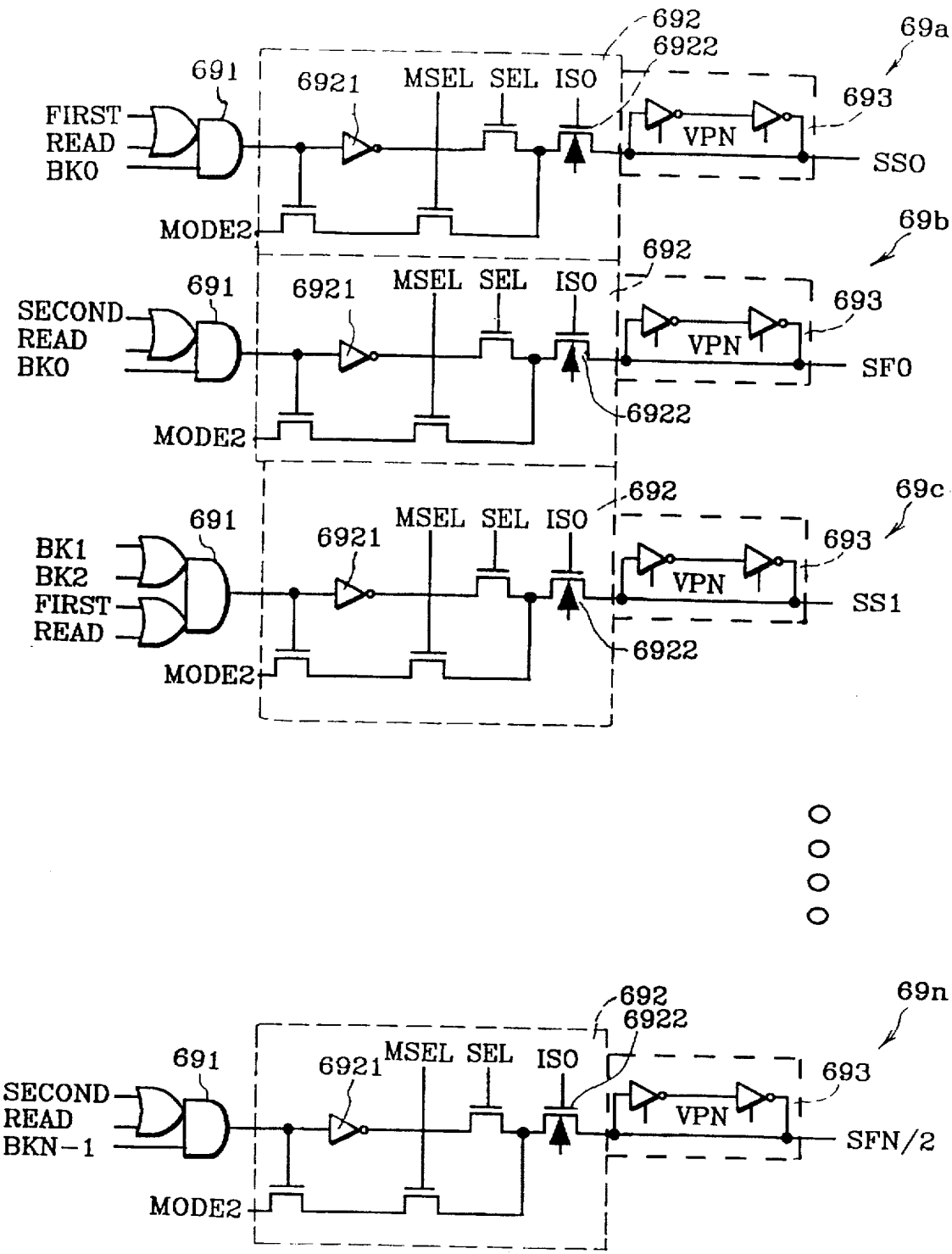
FIG. 23 illustrates source control line drivers for the second preferred embodiment.

FIG. 23 illustrates source control line drivers 69a–69n for use with the basic circuit 60 of FIG. 18. The source control line drivers 69a–69n are substantially similar to the drain line control drivers 68a–68n and also include a decoder 691, a multiplexer 692 coupled to the decoder 691, and a latch 693 for coupling the multiplexer 692 to the OR-plane memory cell array. As compared with the source control line drivers 49a–49n shown in FIG. 15, the multiplexer 692 further includes an inverter 6921 and an N-type pass gate 6922. As such, complementary logic and the prevention of forward currents can be achieved.

Table VII summarizes the bias conditions for the block 0 control line drivers 68a, 69a during the read and program operations:

TABLE VII

| Signal | Read First Side Cell | Program Initialization | Program First Side Cell |
|--------|----------------------|------------------------|--------------------------|
| ISO    | VDD                  | VDD                    | –MV                      |
| FIRST  | VDD                  | 0 V                    | VDD                      |
| SECOND | 0 V                  | 0 V                    | 0 V                      |
| MODE1  | X                    | X                      | 0 V                      |
| MODE2  | X                    | X                      | 0 V                      |
| SEL    | VDD                  | VDD                    | 0 V                      |
| MSEL   | 0 V                  | 0 V                    | VDD                      |
| READ   | VDD                  | 0 V                    | 0 V                      | where:

–MV=Negative Medium Voltage (–5to –8 volts)

Table VIII summarizes the bias conditions for the block 0 control line drivers 68a, 69a during the erase operations:

TABLE VIII

| Signal | Erase Initialization | Erase Second Side Cell (Non-Flash) | Erase Cell (Flash) |
|--------|----------------------|-------------------------------------|---------------------|
| ISO    | VDD                  | –MV                                 | –MV                 |
| FIRST  | 0 V                  | 0 V                                 | VDD                 |
| SECOND | 0 V                  | VDD                                 | VDD                 |
| MODE1  | X                    | 0 V                                 | 0 V                 |
| MODE2  | X                    | 0 V                                 | VDD                 |
| SEL    | VDD                  | 0 V                                 | 0 V                 |
| MSEL   | 0 V                  | VDD                                 | VDD                 |
| READ   | 0 V                  | 0 V                                 | 0 V                 |

The word line driver 50 of FIG. 16 is utilized for the basic circuit 60 of FIG. 18 when the erase operation is defined as the operation in which the threshold voltage of the P-channel transistor cell is reduced. The word line driver 50 operates basically in the same manner when overcoming the over-erase problem, except that the patterns for the signals VPX1, VPX2 are the complementary values of those used in the N-channel transistor cells. The corresponding drain and source control line drivers are similar to those shown in FIGS. 22 and 23. The bias conditions for the block 0 control line drivers during the read, program and erase operations can be found in Tables VII and VIII.

Figure 24:
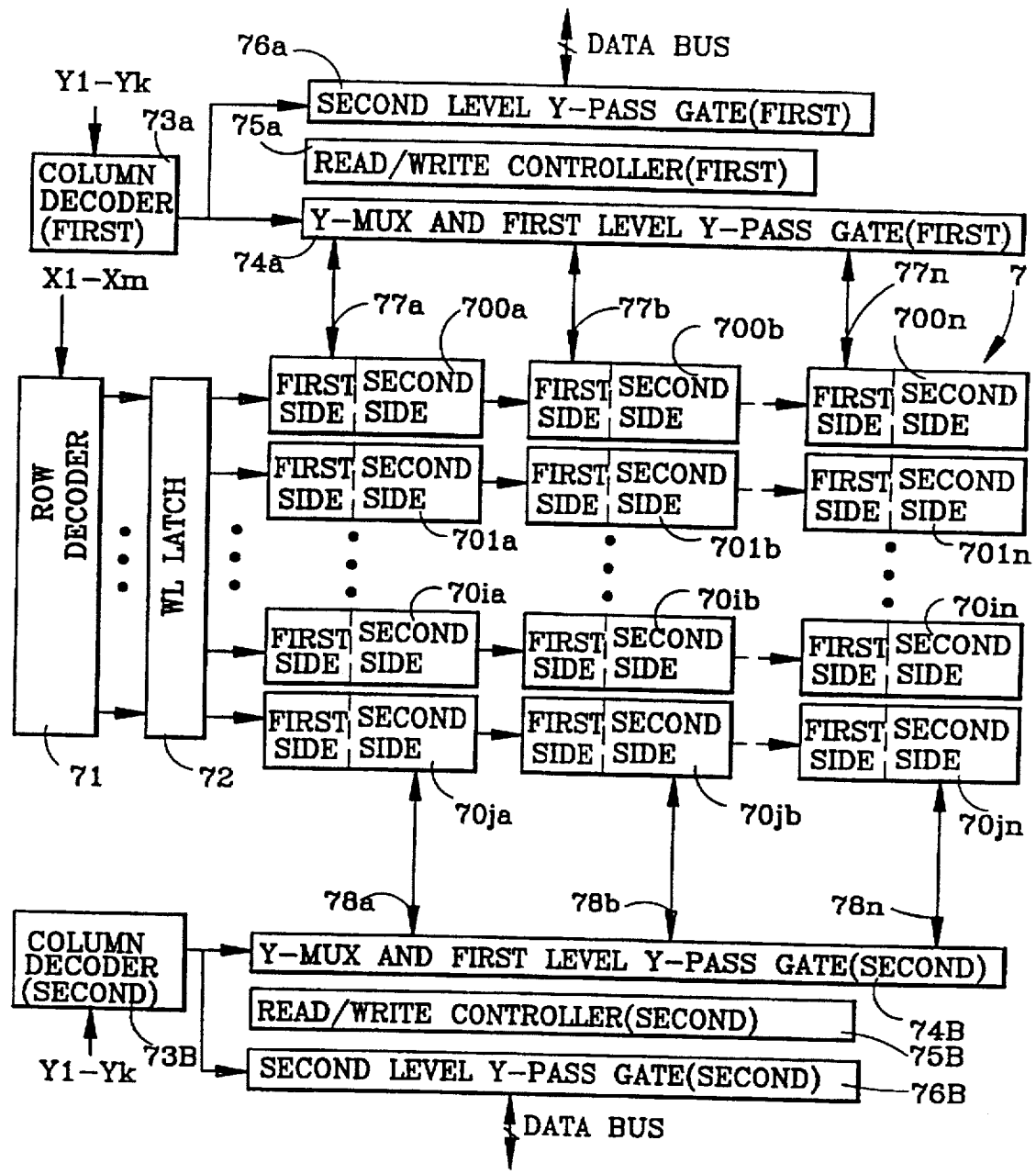
FIG. 24 is a functional block diagram of a modified flash EEPROM which incorporates the third preferred embodiment of an OR-plane memory cell array of this invention.

The flash EEPROM of FIG. 3 can be further modified as shown in FIG. 24. As illustrated, the flash EEPROM includes a modified OR plane memory cell array 7, a row decoder 71 which receives address signals X1-Xm from the off-chip controller or internal sequencer (not shown), a word line latch 72 which couples the row decoder 71 to the memory cell array 7, first and second column decoders 73a, 73b which receive address signals Y1-Yk from the off-chip controller or internal sequencer, first and second second level Y-pass gates 76a, 76b which are coupled to the data bus, first and second read/write controllers 75a, 75b which are coupled respectively to the second level Y-pass gates 76a, 76b, and first and second Y-Mux and first level Y-pass gates 74a, 74b which are coupled to one of the column decoders 73a, 73b, one of the read/write controllers 75a, 75b, and one of the Y-Mux and first level Y-pass gates 74a, 74b.

The memory cell array 7 is partitioned into k blocks, e.g. 700a to 70ja, in the column direction. Each block includes several rows of transistor cells. Every pair of adjacent transistor cells in the row direction are grouped into first and second sides which share a main bit line, e.g. 77a to 77n, via a sub-bit line and a sub-source line, respectively.

Figure 25:
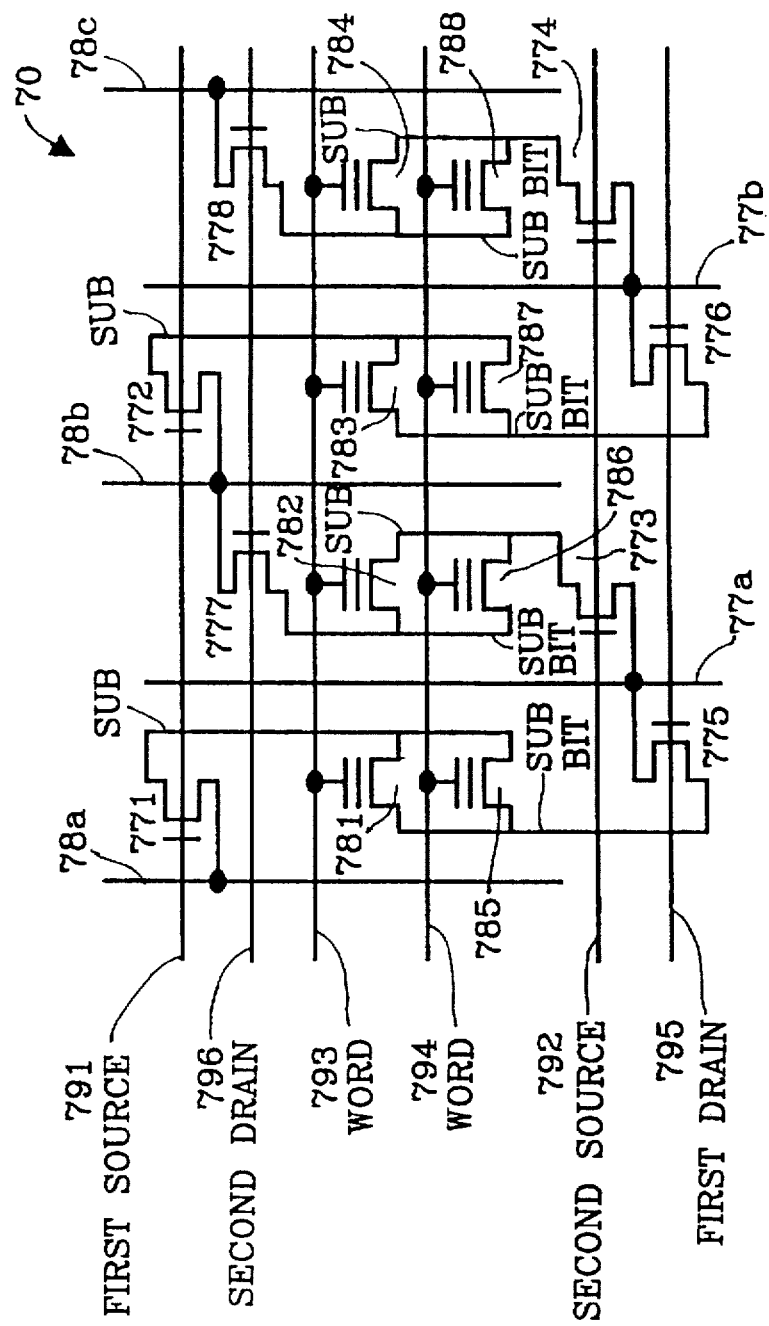
FIG. 25 illustrates a basic circuit of the third preferred embodiment of the OR-plane memory cell array according to this invention.

FIG. 25 is a schematic electrical circuit diagram of a basic circuit 70 of the modified OR-plane memory cell array 7 according to this invention. As shown, the basic circuit 70 includes two rows and four columns of transistor cells 781–788, a first source control gate pair 771, 772, a first drain control gate pair 775, 776, a second source control gate pair 773, 774, and a second drain control gate pair 777, 778. The transistor cells 781–788 in the same row have gate terminals which are coupled to a respective one of first and second word lines 793, 794. The transistor cells 781–788 in the same column have source terminals coupled to a respective one of first to fourth sub-source lines, and drain terminals coupled to a respective one of first to fourth sub-bit lines. The first source control gates 771, 772 have gate terminals coupled to a first source control line 791, drain terminals connected to a respective one of the first and third sub-source lines, and source terminals connected to a respective one of first and second main source lines 78a, 78b. The second source control gates 773, 774 have gate terminals coupled to a second source control line 792, drain terminals connected to a respective one of the second and fourth sub-source lines, and source terminals connected to a respective one of first and second main bit lines 77a, 77b. The first drain control gates 775, 776 have gate terminals coupled to a first drain control line 795, drain terminals connected to a respective one of the first and third sub-bit lines, and source terminals connected to a respective one of the first and second main bit lines 77a, 77b. The second drain control gates 777, 778 have gate terminals coupled to a second drain control line 796, drain terminals connected to a respective one of the second and fourth sub-bit lines, and source terminals connected to a respective one of the second and third main source lines 78b, 78c. Thus, the sub-bit line and the sub-source line for each of the transistor cells are controlled by separate control gates.

In the flash EEPROM of FIG. 3, the erase or program patterns cannot pass through the first and second drain control gates 473, 474, 477, 478 of the memory cell array 4 simultaneously. This, however, is possible in the modified flash EEPROM of FIG. 24 in view of the duplicating circuit scheme that is employed in the latter. The source control gates 771, 772, 773, 774 should be turned off when the drain control gates 775, 776, 777, 778 pass the erase or program patterns. When reading the transistor cells, the associated drain control gates 775, 776, 777, 778 are turned on, and the source voltage can be received from the read/write controller 75a, 75b by turning on the corresponding source control gates 771, 772, 773, 774. During the read operation, the read/write controllers 75a, 75b alternately serve as a sense amplifier or the source generator. For example, when reading the transistor cells on the first side, the first read/write controller 75a serves as the sense amplifier, while the second read/write controller 75b serves as the source generator. Referring to FIG. 9, when the read/write controller serves as the source generator, the transistors 426, 427 are turned off, while the signal RESETB maintains the node N4 at the VDD level and the node N1 at the ground level. Thus, the signal PGM/ERS will pass the ground voltage through the transistor 428 to the data line (DL). This way, the ground voltage will be transferred to the corresponding bit line through the Y-Mux and first level Y-pass gate 74a, 74b.

Table IX summarizes the bias conditions for the basic circuit 70 during read, erase and program operations when the erase operation is defined as an operation in which the threshold voltage of a transistor cell is increased, while the program operation is defined as an operation in which the threshold voltage is decreased:

TABLE IX

| Lead | Serial Reading Cell 781 | Random Reading Cell 786 | Bit Erase Cell 787 | Flash Erase Cells 781 to 784 | Program Cell 788 |
|---|---|---|---|---|---|
| 791 | VDD | 0 V | 0 V | 0 V | 0 V |
| 796 | 0 V | VDD | MV | MV | MV |
| 793 | VDD | 0 V | MV | HV | 0 V |
| 794 | 0 V | VDD | HV | MV | -NV |
| 792 | 0 V | VDD | 0 V | 0 V | 0 V |
| 795 | VDD | 0 V | MV | MV | MV |
| 77a | Vs | 0 V | MV | 0 V | 0 V |
| 77b | 0 V | 0 V | 0 V | 0 V | MV |
| 78a | 0 V | 0 V | MV | 0 V | 0 V |
| 78b | 0 V | Vs | MV | 0 V | 0 V |
| 78c | 0 V | 0 V | MV | 0 V | 0 V | where:
HV=High Voltage (12–15 volts)
MV=Medium Voltage (5–8 volts)
Vs=Bit Line Sense Voltage (1.2 volts)
−NV=Negative Voltage (−10 volts)

Table X summarizes the bias conditions for the basic circuit 70 during the read, erase and program operations when the erase operation is defined as an operation in which the threshold voltage is decreased, while the program operation is defined as an operation in which the threshold voltage is increased:

TABLE X

| Lead | Serial Reading Cell 781 | Random Reading Cell 786 | Bit Erase Cell 787 | Flash Erase Cells 781 to 784 | Program Cell 788 |
|---|---|---|---|---|---|
| 791 | VDD | 0 V | 0 V | 0 V | 0 V |
| 796 | 0 V | VDD | MV | MV | MV |
| 793 | VDD | 0 V | 0 V | -NV | HV |
| 794 | 0 V | VDD | -NV | 0 V | MV |
| 792 | 0 V | VDD | 0 V | 0 V | 0 V |
| 795 | VDD | 0 V | MV | MV | MV |
| 77a | Vs | 0 V | 0 V | MV | MV |
| 77b | 0 V | 0 V | MV | MV | MV |
| 78a | 0 V | 0 V | 0 V | MV | MV |
| 78b | 0 V | Vs | 0V | MV | MV |
| 78c | 0 V | 0 V | 0 V | MV | 0 V |

Figure 26:
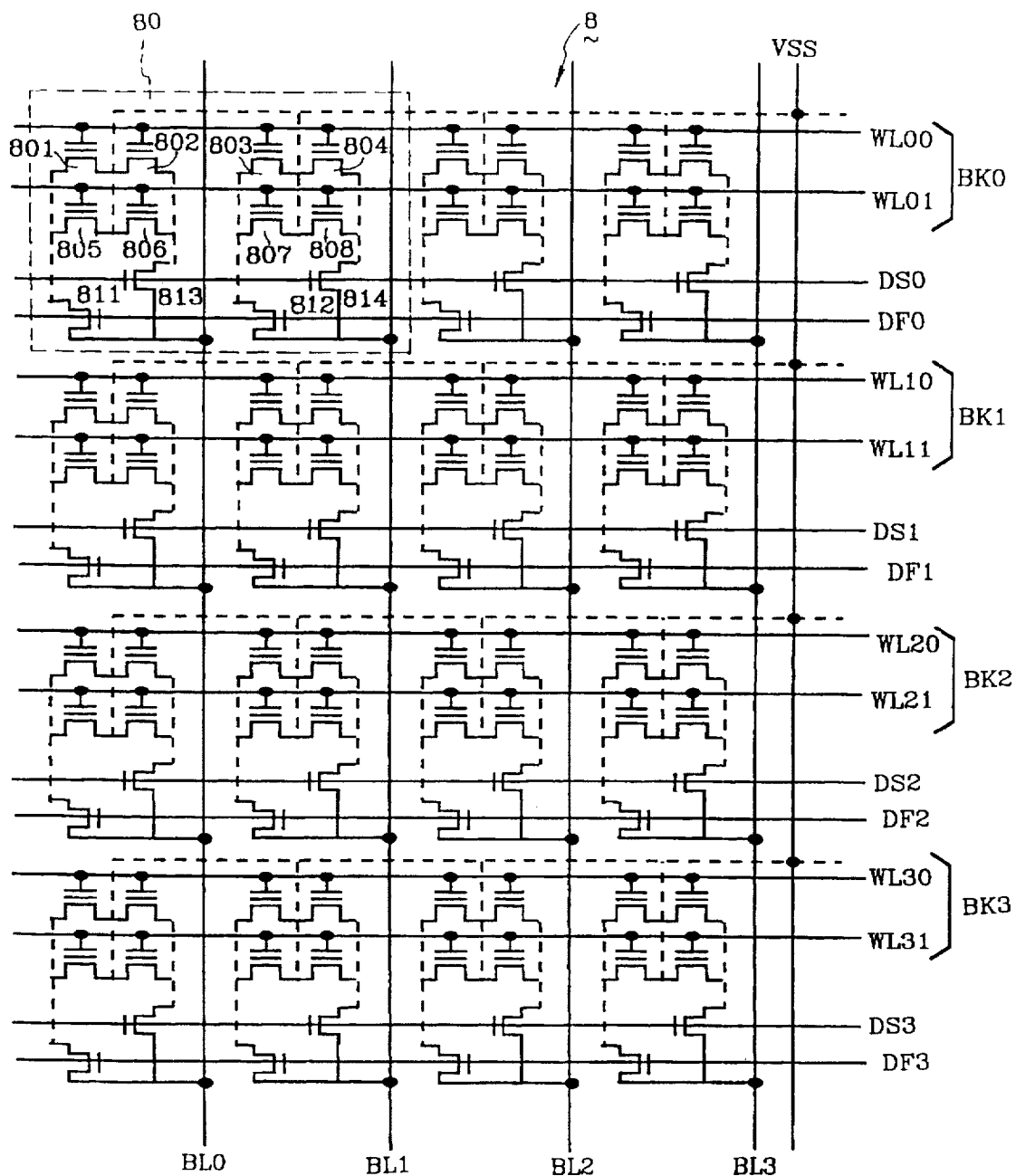
FIG. 26 illustrates the fourth preferred embodiment of an OR-plane memory cell array according to this invention.

In some applications where speed and bit-based erasure capability are not of utmost concern, the OR-plane memory cell array of the present invention can be further modified as shown in FIG. 26. As illustrated, the memory cell array 8 includes a plurality of basic circuits 80, each of which comprises two rows and four columns of transistor cells 801–808, a first drain control gate pair 811, 812, and a second drain control gate pair 813, 814. The transistor cells 801–808 in the same row have gate terminals which are coupled to a respective word line, e.g. WL00, WL01. The transistor cells 801–808 in the same column have source terminals coupled to a ground line, and drain terminals coupled to one of first to fourth sub-bit lines. Thus, the voltage applied to the two drain sides will be the same during the erase operation. Unlike the basic circuits of the previous embodiments, there are no source control gates employed in this embodiment. Instead, every eight sub-source lines are connected to one metal main source line VSS. As such, the basic circuit 80 is no longer provided with a bit-based write capability.

The first drain control gates 811, 812 have gate terminals coupled to a first drain control line, e.g. DF0, drain terminals connected to a respective one of the first and third sub-bit lines, and source terminals connected to a respective main bit line BL0–BL3. The second drain control gates 813, 814 have gate terminals coupled to a second drain control line, e.g. DS0, drain terminals connected to a respective one of the second and fourth sub-bit lines, and source terminals connected to the respective main bit line BL0–BL3.

The advantages of the basic circuit 80 include reduced costs due to the reduced layout area. Also, since the BN+ strips (indicated by the dotted lines) can be connected to a large number of transistor cells in a memory block, the increased resistance on the sub-bit lines will slow down the read access time. The basic circuit 80 is thus suitable for use in slow speed applications, such as during the playback of synthesized audio signals stored in the flash memory which require a sampling rate of about 8 K/sec such that the access time is allowed to be around the range of several hundred micro-seconds.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A memory cell array comprising a matrix of basic circuits, each of said basic circuits including:
   first and second word lines;
   first and second source control lines;
   first and second drain control lines;
   first, second and third main source lines;
   first and second main bit lines;
   two rows and four columns of transistor cells, said transistor cells in each of said rows having gate terminals which are coupled to a respective one of said first and second word lines, said transistor cells in each of said columns having source terminals coupled to a respective one of first, second, third and fourth sub-source lines, and drain terminals coupled to a respective one of first, second, third and fourth sub-bit lines;
   a first source control gate pair including first source control gates with gate terminals coupled to said first source control line, each of said first source control gates further having a drain terminal coupled to a respective one of said first and fourth sub-source lines, and a source terminal coupled to a respective one of said first and third main source lines;
   a second source control gate pair including second source control gates with gate terminals coupled to said second source control line, each of said second source control gates further having a drain terminal coupled to a respective one of said second and third sub-source lines, and a source terminal coupled to said second main source line;

a first drain control gate pair including first drain control gates with gate terminals coupled to said first drain control line, each of said first drain control gates further having a drain terminal coupled to a respective one of said first and fourth sub-bit lines, and a source terminal coupled to a respective one of said first and second main bit lines; and a second drain control gate pair including second drain control gates with gate terminals coupled to said second drain control line, each of said second drain control gates further having a drain terminal coupled to a respective one of said second and third sub-bit lines, and a source terminal coupled to a respective one of said first and second main bit lines.

2. The memory cell array as claimed in claim 1, wherein each of said sub-bit lines and said sub-source lines is formed as a buried N+ layer.

3. The memory cell array as claimed in claim 1, wherein each of said sub-bit lines and said sub-source lines is disposed between one of said main source lines and one of said main bit lines.

4. The memory cell array as claimed in claim 1, wherein each of said transistor cells, said source control gates and said drain control gates is an N-channel cell.

5. The memory cell array as claimed in claim 1, wherein each of said transistor cells, said source control gates and said drain control gates is a P-channel cell.

6. A memory cell array comprising a matrix of basic circuits, each of said basic circuits including:

first and second word lines;

first and second source control lines;

first and second drain control lines;

first, second and third main source lines;

first and second main bit lines;

two rows and four columns of transistor cells, said transistor cells in each of said rows having gate terminals which are coupled to a respective one of said first and second word lines, said transistor cells in each of said columns having source terminals coupled to a respective one of first, second, third and fourth sub-source lines, and drain terminals coupled to a respective one of first, second, third and fourth sub-bit lines;

a first source control gate pair including first source control gates with gate terminals coupled to said first source control line, each of said first source control gates further having a drain terminal coupled to a respective one of said first and third sub-source lines, and a source terminal coupled to a respective one of said first and second main source lines;

a second source control gate pair including second source control gates with gate terminals coupled to said second source control line, each of said second source control gates further having a drain terminal coupled to a respective one of said second and fourth sub-source lines, and a source terminal coupled to a respective one of said first and second main bit lines;

a first drain control gate pair including first drain control gates with gate terminals coupled to said first drain control line, each of said first drain control gates further having a drain terminal coupled to a respective one of said first and third sub-bit lines, and a source terminal coupled to a respective one of said first and second main bit lines; and a second drain control gate pair including second drain control gates with gate terminals coupled to said second drain control line, each of said second drain control gates further having a drain terminal coupled to a respective one of said second and fourth sub-bit lines, and a source terminal coupled to a respective one of said second and third main source lines.

7. The memory cell array as claimed in claim 6, wherein each of said sub-bit lines and said sub-source lines is formed as a buried N+ layer.

8. The memory cell array as claimed in claim 6, wherein each of said sub-bit lines and said sub-source lines is disposed between one of said main source lines and one of said main bit lines.

9. A memory cell array comprising a matrix of basic circuits, each of said basic circuits including:

first and second word lines;

first and second drain control lines;

first and second main bit lines;

two rows and four columns of transistor cells, said transistor cells in each of said rows having gate terminals which are coupled to a respective one of said first and second word lines, said transistor cells in each of said columns having grounded source terminals, and drain terminals coupled to a respective one of first, second, third and fourth sub-bit lines;

a first drain control gate pair including first drain control gates with gate terminals coupled to said first drain control line, each of said first drain control gates further having a drain terminal coupled to a respective one of said first and third sub-bit lines, and a source terminal coupled to a respective one of said first and second main bit lines; and a second drain control gate pair including second drain control gates with gate terminals coupled to said second drain control line, each of said second drain control gates further having a drain terminal coupled to a respective one of said second and fourth sub-bit lines, and a source terminal coupled to a respective one of said first and second main bit lines.

10. The memory cell array as claimed in claim 9, wherein each of said sub-bit lines is formed as a buried N+ layer.

* * * * *